(12) United States Patent
Sumitani et al.

(10) Patent No.: US 11,265,502 B2
(45) Date of Patent: Mar. 1, 2022

(54) SOLID-STATE IMAGING DEVICE

(71) Applicant: Panasonic Semiconductor Solutions Co., Ltd., Kyoto (JP)

(72) Inventors: Norihiko Sumitani, Osaka (JP); Yosuke Higashi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 119 days.

(21) Appl. No.: 15/930,251

(22) Filed: May 12, 2020

(65) Prior Publication Data

US 2020/0275042 A1 Aug. 27, 2020

Related U.S. Application Data

(63) Continuation of application No. PCT/JP2018/041593, filed on Nov. 9, 2018.

(30) Foreign Application Priority Data

Nov. 29, 2017 (JP) .............................. JP2017-229392

(51) Int. Cl.
*H04N 5/3745* (2011.01)
*H04N 5/376* (2011.01)
*H04N 5/378* (2011.01)

(52) U.S. Cl.
CPC .......... *H04N 5/378* (2013.01); *H04N 5/3765* (2013.01); *H04N 5/37455* (2013.01); *H04N 5/37457* (2013.01)

(58) Field of Classification Search
None
See application file for complete search history.

(56) References Cited

U.S. PATENT DOCUMENTS 7,742,334 B2 * 6/2010 Fujisawa ............ G11C 16/3459
365/185.03
2016/0309107 A1 10/2016 Sumitani et al.

FOREIGN PATENT DOCUMENTS

WO 2015/111368 A1 7/2015

OTHER PUBLICATIONS

International Searcjh Report issued in corresponding International Patent Application No. PCT/JP2018/041593, dated Jan. 22, 2019, with English translation.

* cited by examiner

*Primary Examiner* — Mark T Monk
(74) *Attorney, Agent, or Firm* — McDermott Will & Emery LLP

(57) ABSTRACT

A solid-state imaging device includes: a latch circuit that holds a digital signal of pixel data, the digital signal having 1 bit; a driver circuit that outputs the digital signal held in the latch circuit to a read bit line pair; a sense amplifier connected to the read bit line pair; and a selector circuit that selects whether the digital signal output from the sense amplifier is to be output in normal form or in inverted form.

13 Claims, 12 Drawing Sheets

FIG. 8

|  | DATA<5:1> | | | | |
|---|---|---|---|---|---|
| DATA1 | 0 | 0 | 0 | 0 | 0 |
| DATA2 | 1 | 1 | 1 | 1 | 1 |
| DATA3 | 0 | 1 | 0 | 1 | 1 |
| DATA4 | 0 | 0 | 1 | 0 | 0 |
| DATA5 | 1 | 1 | 1 | 0 | 0 |
| DATA6 | 1 | 1 | 0 | 0 | 0 |

FIG. 9

| CYCLE | INPre | INPostt | EXOROUT_<5:1> | | | | | HAMMING DISTANCE | FLIP_I |
|---|---|---|---|---|---|---|---|---|---|
| 3 | DATA2 | DATA1 | 1 | 1 | 1 | 1 | 1 | 5 | H |
| 4 | DATA3 | DATA2 (INVERTED) | 0 | 1 | 0 | 1 | 1 | 3 | H |
| 5 | DATA4 | DATA3 (INVERTED) | 1 | 0 | 0 | 0 | 0 | 1 | L |
| 6 | DATA5 | DATA4 | 1 | 1 | 0 | 0 | 0 | 2 | L |
| 7 | DATA6 | DATDA5 | 0 | 0 | 1 | 0 | 1 | 1 | L |

FIG. 10

| CYCLE | OUTPUT_<5:1> | | | | | FLIPOUT |
|---|---|---|---|---|---|---|
| 4 | 0 | 0 | 0 | 0 | 0 | L |
| 5 | 0 | 0 | 0 | 0 | 0 | H |
| 6 | 1 | 0 | 1 | 0 | 0 | H |
| 7 | 0 | 0 | 1 | 0 | 0 | L |
| 8 | 1 | 1 | 1 | 0 | 0 | L |

SOLID-STATE IMAGING DEVICE

CROSS REFERENCE TO RELATED APPLICATIONS

This application is a U.S. continuation application of PCT International Patent Application Number PCT/JP2018/041593 filed on Nov. 9, 2018, claiming the benefit of priority of Japanese Patent Application Number 2017-229392 filed on Nov. 29, 2017, the entire contents of which are hereby incorporated by reference.

BACKGROUND

1. Technical Field

The present disclosure relates to a solid-state imaging device.

2. Description of the Related Art

FIG. 14 is a diagram illustrating the configuration of a data transfer circuit used in an MOS sensor disclosed in International Publication No. WO2015/111368.

This data transfer circuit includes a plurality of latch driver circuits 2209A. Each latch driver circuit 2209A includes driver circuit 2214 for driving latch circuit 2213 holding pixel data and read bit lines RBL1 and NRBL1, sense amplifier 2210A, precharge circuit 2215A, and flip-flop 2111.

According to this configuration, driver circuit 2214 drives read bit lines RBL1 and NRBL1 at a low amplitude in accordance with data in latch circuit 2213, and the data in latch circuit 2213 is detected by sense amplifier 2210A. The output of sense amplifier 2210A corresponds to one bit of the multi-bit pixel data. This makes it possible to read out the pixel data quickly while consuming little power. The current consumed by driver circuit 2214 and precharge circuit 2215A for the readout is substantially the same regardless of whether the pixel data is 0 data or 1 data, and thus does not depend on the data.

However, according to the past technique disclosed in International Publication No. WO2015/111368, the current consumed by the circuits following flip-flop 2111 will vary greatly depending on the state of data read out in time series. The greater the bit width of the pixel data is, the more current will be consumed by the circuits following flip-flop 2111.

Thus if this past technique is used in an image sensor which has a large bit width and which places a heavy load on stages after the flip-flop (e.g., a large-format image sensor), a large current change will occur spontaneously if different pixel data is read out immediately after a series of pixel data identical in time series. This causes a problem in that the change in current consumption acts as a source of noise for other circuits (e.g., pixels), which can greatly affect the image quality.

In light of the above-described problem, the present disclosure provides a solid-state imaging device that suppresses noise produced when transferring A/D converted pixel data, and suppresses a drop in image quality.

SUMMARY

To solve the above-described problem, a solid-state imaging device according to an aspect of the present disclosure includes: a latch circuit that holds a digital signal constituting pixel data, the digital signal having 1 bit; a driver circuit that outputs the digital signal held in the latch circuit to a read bit line pair; a sense amplifier connected to the read bit line pair; and a selector circuit that selects whether the digital signal to be output from the sense amplifier is to be output in normal form or in inverted form.

With the solid-state imaging device according to an aspect of the present disclosure, noise produced when transferring A/D converted pixel data can be suppressed, and a drop in image quality can be suppressed.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 8 is a diagram illustrating an example of pixel data according to Embodiment 2;

FIG. 9 is a diagram illustrating input states of the exclusive OR circuit, and output states of an inversion flag, in cycles 3 to 7, according to Embodiment 2;

FIG. 10 is a diagram illustrating output states of the data transfer circuit in cycles 4 to 8, according to Embodiment 2;

DETAILED DESCRIPTION OF THE EMBODIMENTS

Embodiments of the present disclosure will be described hereinafter with reference to the drawings.

Note that the following embodiments describe specific examples of the present disclosure. The numerical values, shapes, materials, constituent elements, arrangements and connection states of constituent elements, steps, orders of steps, and the like in the following embodiments are merely examples, and are not intended to limit the present disclosure. Additionally, of the constituent elements in the following embodiments, constituent elements not denoted in the independent claims, which express the broadest interpretation, will be described as optional constituent elements.

Embodiment 1

Figure 1:
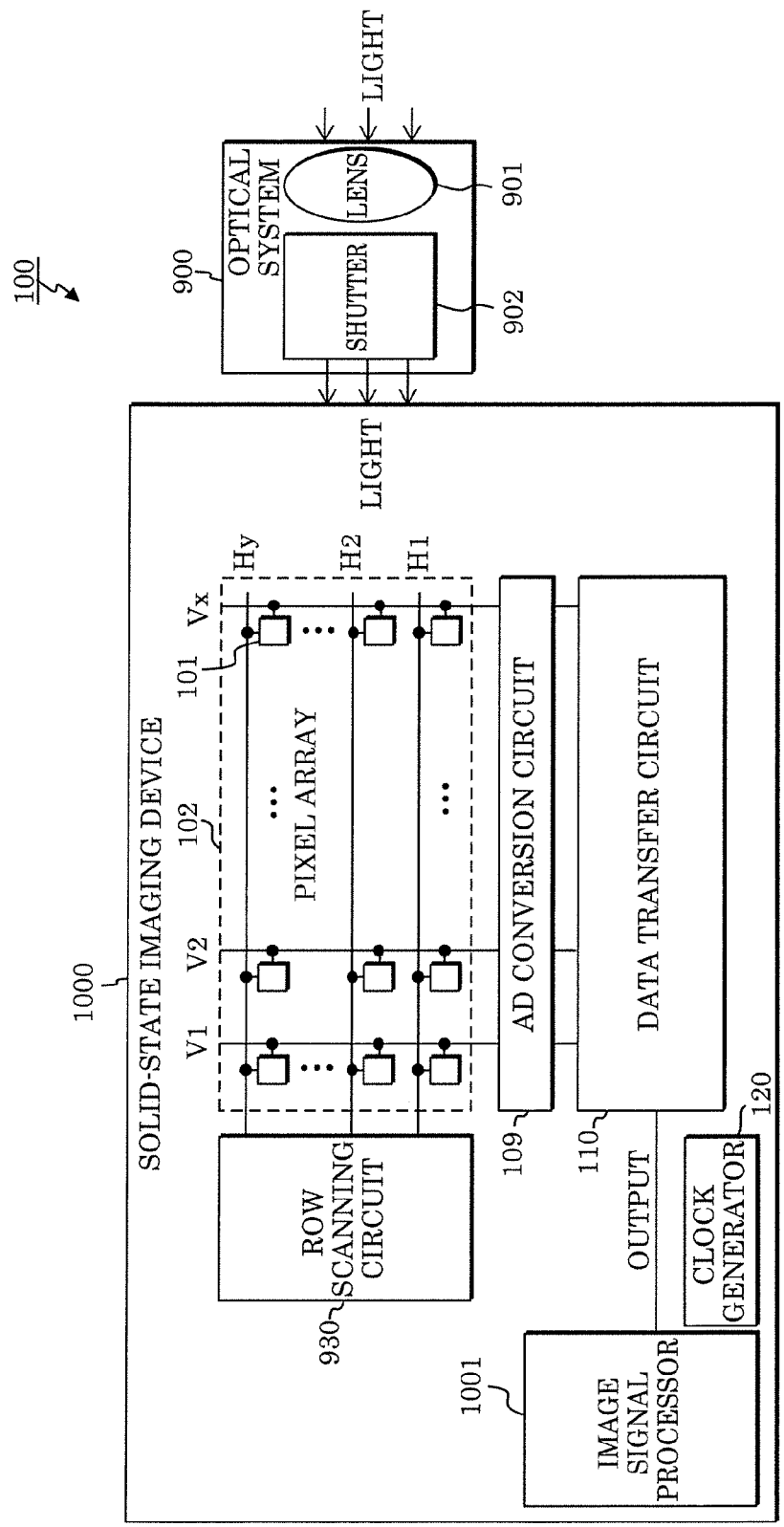
FIG. 1 is a block diagram illustrating an example of the configuration of an image capturing device according to Embodiment 1.

FIG. 1 is a block diagram illustrating an example of the configuration of image capturing device 100 according to Embodiment 1. As illustrated in FIG. 1, image capturing device 100 is a camera or a camera module, for example, and includes optical system 900 and solid-state imaging device 1000.

Optical system 900 includes lens 901 and mechanical shutter 902. Lens 901 focuses light (e.g., visible light) from an object to form an object image on pixel array 102 of solid-state imaging device 1000. Mechanical shutter 902 is disposed in an optical path between lens 901 and solid-state imaging device 1000, and controls an amount of light guided onto pixel array 102.

Solid-state imaging device 1000 includes pixel array 102, row scanning circuit 930, AD conversion circuit 109, data transfer circuit 110, clock generator 120, and image signal processor 1001.

Image signal processor 1001 carries out various types of signal processing (image processing) on digital output data OUTPUT which has been output by data transfer circuit 110.

Row scanning circuit 930 scans a plurality of pixel units 101, on a row-by-row basis, to read out signals from pixel units 101 on a row-by-row basis.

Pixel array 102 includes the plurality of pixel units 101 arranged in rows and columns. Here, pixel unit 101 includes a light receiver having a photoelectric converter that carries out photoelectric conversion. The photoelectric converter is, for example, a light-sensitive element such as a photodiode or a photogate, a photoelectric conversion film constituted by amorphous silicon, or an organic photoelectric conversion film. Pixel unit 101 further includes a device for reading out a signal produced through photoelectric conversion and a device for carrying out reset operations, as necessary.

Clock generator 120 generates a clock signal (reference clock signal) and supplies the clock signal to binary counter 104, column AD conversion circuits 106, timing generation circuit 340, and column scanning circuit 300.

Figure 2:
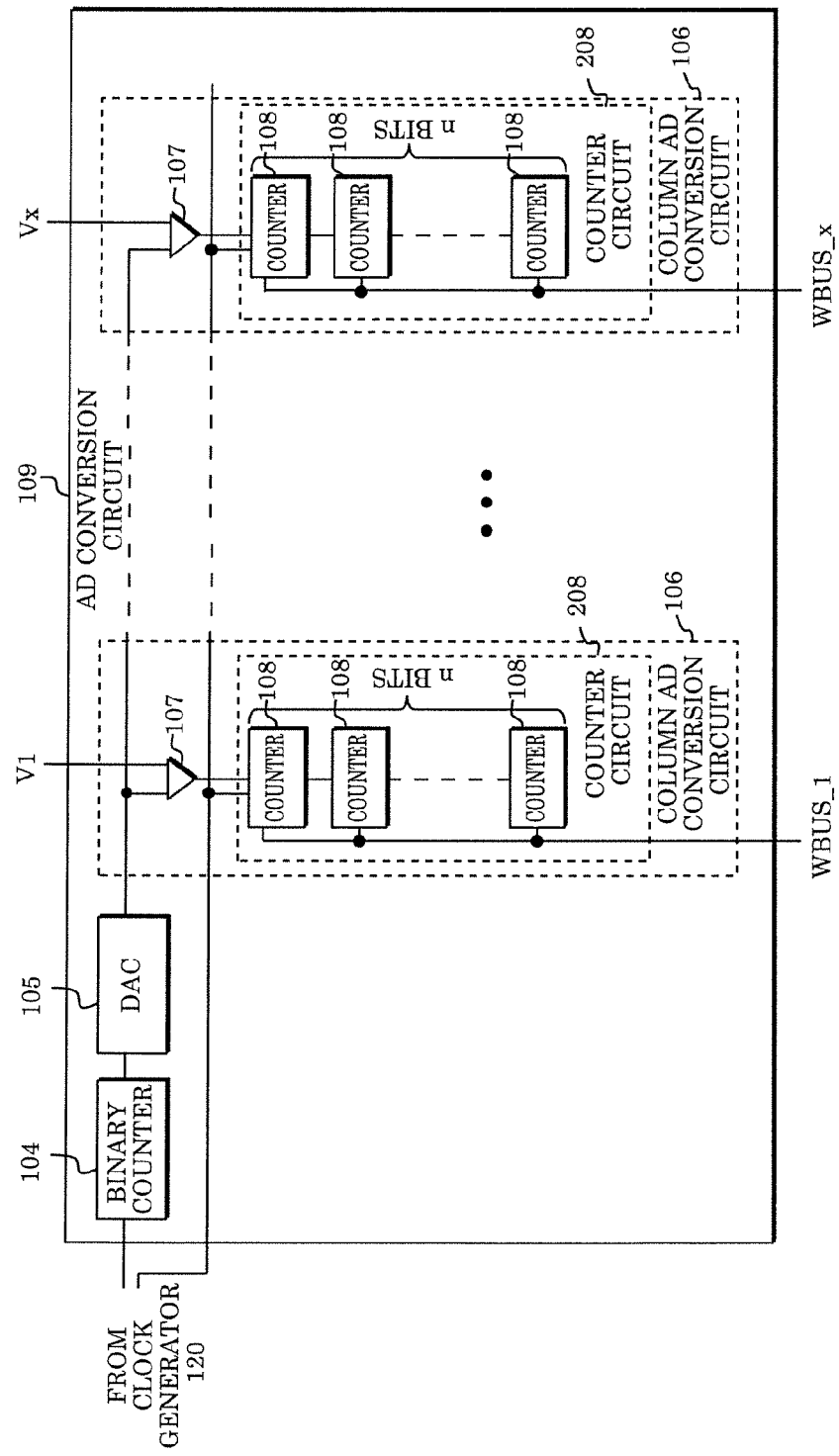
FIG. 2 is a block diagram illustrating an example of the configuration of an AD conversion circuit according to Embodiment 1.

FIG. 2 is a diagram illustrating an example of the configuration of AD conversion circuit 109.

AD conversion circuit 109 includes binary counter 104, DA conversion circuit (abbreviated "DAC" hereinafter) 105, a plurality of column AD conversion circuits 106, and a plurality of counter-latch data transfer buses WBUS (WBUS_1 to WBUS_x).

Figure 3:
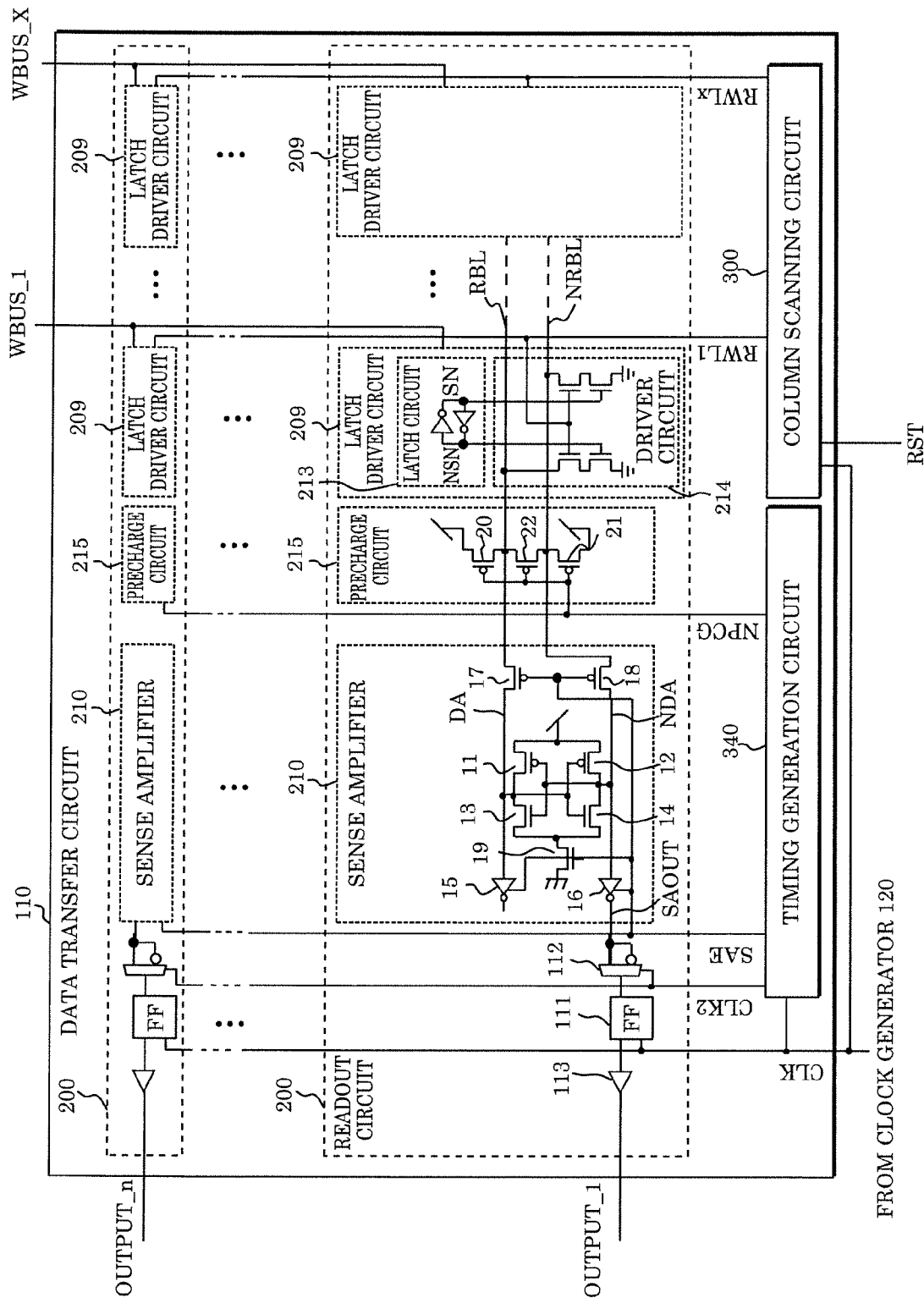
FIG. 3 is a circuit diagram illustrating an example of the configuration of a data transfer circuit according to Embodiment 1 in detail.

Column AD conversion circuit 106 is provided for every ½ column, every column, or every plurality of columns. Column AD conversion circuit 106 converts an analog signal output from the corresponding pixel unit 101 into a digital signal and holds the digital signal. In FIGS. 1 to 3, the plurality of column AD conversion circuits 106 correspond one-to-one to vertical signal lines V1 to Vx within pixel array 102. In other words, x column AD conversion circuits 106 are provided.

Each column AD conversion circuit 106 has a function for converting the analog signal into an n-bit digital signal. Column AD conversion circuit 106 has an n-bit counter circuit 208. Counter circuit 208 has n 1-bit counters 108, and thus constitutes an n-bit counter.

DAC 105 generates an analog ramp voltage (triangle wave) in accordance with a binary value input from binary counter 104. This analog ramp voltage is input to comparator 107 within column AD conversion circuit 106.

Each column AD conversion circuit 106 includes comparator 107 and counter circuit 208.

Comparator 107 compares analog ramp voltage generated by DAC 105 with the pixel signal, among pixel signals obtained from pixel units 101 via vertical signal lines V1 to Vx, belonging to the corresponding column, for each of row lines H1 to Hy.

The n-bit counter circuit 208 included in column AD conversion circuit 106 counts a comparison time until a voltage value in the vertical signal line matches the analog ramp voltage, for each pixel unit 101 (a counting operation). This count value is n-bit pixel data.

FIG. 3 is a diagram illustrating an example of the configuration of data transfer circuit 110.

Data transfer circuit 110 includes a plurality of readout circuits 200, timing generation circuit 340, and column scanning circuit 300.

The number of readout circuits 200 provided is the same as the number of bits in the pixel data. Data transfer circuit 110 in FIG. 3 includes n readout circuits 200. The n readout circuits 200 output n-bit pixel data. The bits constituting the n-bit pixel data are denoted as OUTPUT_1 to OUTPUT_n. Each readout circuit 200 includes x latch driver circuits 209, precharge circuits 215, sense amplifiers 210, selector circuits 112, flip-flops 111, and output buffers 113, corresponding to the x pixel units 101 arranged in the horizontal direction. The n readout circuits 200 illustrated in FIG. 3 are configured to be capable of selecting between normal output (i.e., non-inverted output) and inverted output of the n-bit pixel data in selector circuits 112. Through this selection, for example, incidences of pixel data having the same value being output successively can be reduced, and for example, the successive output of pixel data with large bit changes can be mitigated.

In FIG. 3, the number of latch driver circuits 209 is x×n. In other words, x latch driver circuits 209 are disposed in a row direction, and n in a column direction. Each latch driver circuit 209 includes latch circuit 213 and driver circuit 214. Driver circuit 214 is connected to latch circuit 213, as well as to read bit lines RBL and NRBL.

The n latch circuits 213 arranged in the column direction latch the n-bit pixel data corresponding to counter circuit 208 in FIG. 2. After the counting operations by counter circuit 208 provided in each column are complete, the n-bit count value in counter circuit 208 is transferred, as pixel data, to latch circuit 213 within data transfer circuit 110 through counter-latch data transfer bus WBUS. As a result, x instances of n-bit pixel data are stored in x×n latch circuits 213 via counter-latch data transfer buses WBUS_1 to WBUS_x.

The n driver circuits 214 disposed in each column are selected by read word lines RWL1 to RWLx. The n driver circuits 214 in the selected column output the n-bit digital signal held in the corresponding n latch circuits 213 to n pairs of read bit line pairs as a signal having an amplitude lower than the output of latch circuits 213. Each read bit line pair is constituted by read bit line RBL and read bit line NRBL. Thus when one of read word lines RWL1 to RWLx is selected, the n-bit pixel data held in latch circuits 213 within the n latch driver circuits 209 connected to the selected read word line is sent to the n pairs of read bit lines RBL and NRBL.

Clock signal CLK from clock generator 120 is supplied to column scanning circuit 300 and timing generation circuit 340.

Column scanning circuit 300 generates a pulse signal that sequentially selects read word lines RWL1 to RWLx.

Timing generation circuit 340 generates the following: a pulse signal for driving a sense amplifier enable signal line connected to sense amplifiers 210 (sense amplifier enable signal SAE); a pulse signal for precharging read bit lines RBL and NRBL connected to precharge circuits 215 (precharge signal NPCG); and clock CLK2, which has a cycle twice that of clock CLK connected to selector circuits 112.

The n sense amplifiers 210 amplify the signals transferred from the n pairs of read bit lines RBL and NRBL, converting those signals to normal digital signals as a result. The obtained digital signals are input to flip-flops 111 via selector circuits 112 and output from output buffers 113 via flip-flops 111.

The n selector circuits 112 select between normal output and inverted output of the n-bit pixel data from the n sense amplifiers 210. Each selector circuit 112 includes a normal input terminal, an inverting input terminal, an output terminal, and a control terminal. 1-bit data among the n-bit pixel data from the corresponding sense amplifier is input to the normal input terminal. 1-bit data among the n-bit pixel data from the corresponding sense amplifier is also input to the inverting input terminal. The 1-bit data input to the inverting input terminal is inverted. In the present embodiment, clock signal CLK2 is input to the control terminal of selector circuit 112 as a selection control signal. When the selection control signal is at low level, selector circuit 112 outputs the 1-bit data input to the normal input terminal, i.e., carries out normal output, whereas when the selection control signal is at high level, selector circuit 112 outputs data obtained by inverting the 1-bit data input to the inverting input terminal, i.e., carries out inverted output. In FIG. 3, the selection control signal is clock signal CLK2, and thus normal output and inverted output switch from column to column. As a result, selector circuit 112 carries out normal output in odd-numbered columns and inverted output in even-numbered columns, for example.

Next, data transfer circuit 110 will be described with reference to the circuit diagrams in FIGS. 1 to 3 and the waveform diagram in FIG. 4.

The following descriptions assume that the n latch circuits 213 corresponding to each column in FIG. 3 hold the n-bit pixel data transferred from the corresponding n counters 108.

Sense amplifier enable signal SAE generated by column scanning circuit 300 and timing generation circuit 340 is input to the n sense amplifiers 210. When sense amplifier enable signal SAE is activated to H (high) level, each sense amplifier 210 amplifies and transforms a minute potential difference between read bit lines RBL and NRBL into a digital signal and outputs the obtained signal as sense amplifier output signal SAOUT.

Sense amplifier output signals SAOUT from the n sense amplifiers 210 are input to the n selector circuits 112. As described above, a clock signal (CLK2) having twice the readout cycle is input to each selector circuit 112 as the selection control signal. The output of each selector circuit 112 is connected to an input terminal of flip-flop 111. A signal output from flip-flop 111 via output buffer 113 is output as output data OUTPUT_k. Here, k is an integer from 1 to n.

Precharge signal NPCG generated by column scanning circuit 300 and timing generation circuit 340 is input to the n precharge circuits 215. Precharge circuit 215 precharges read bit lines RBL and NRBL to H level when precharge signal NPCG has been activated to L (low) level.

Figure 4:
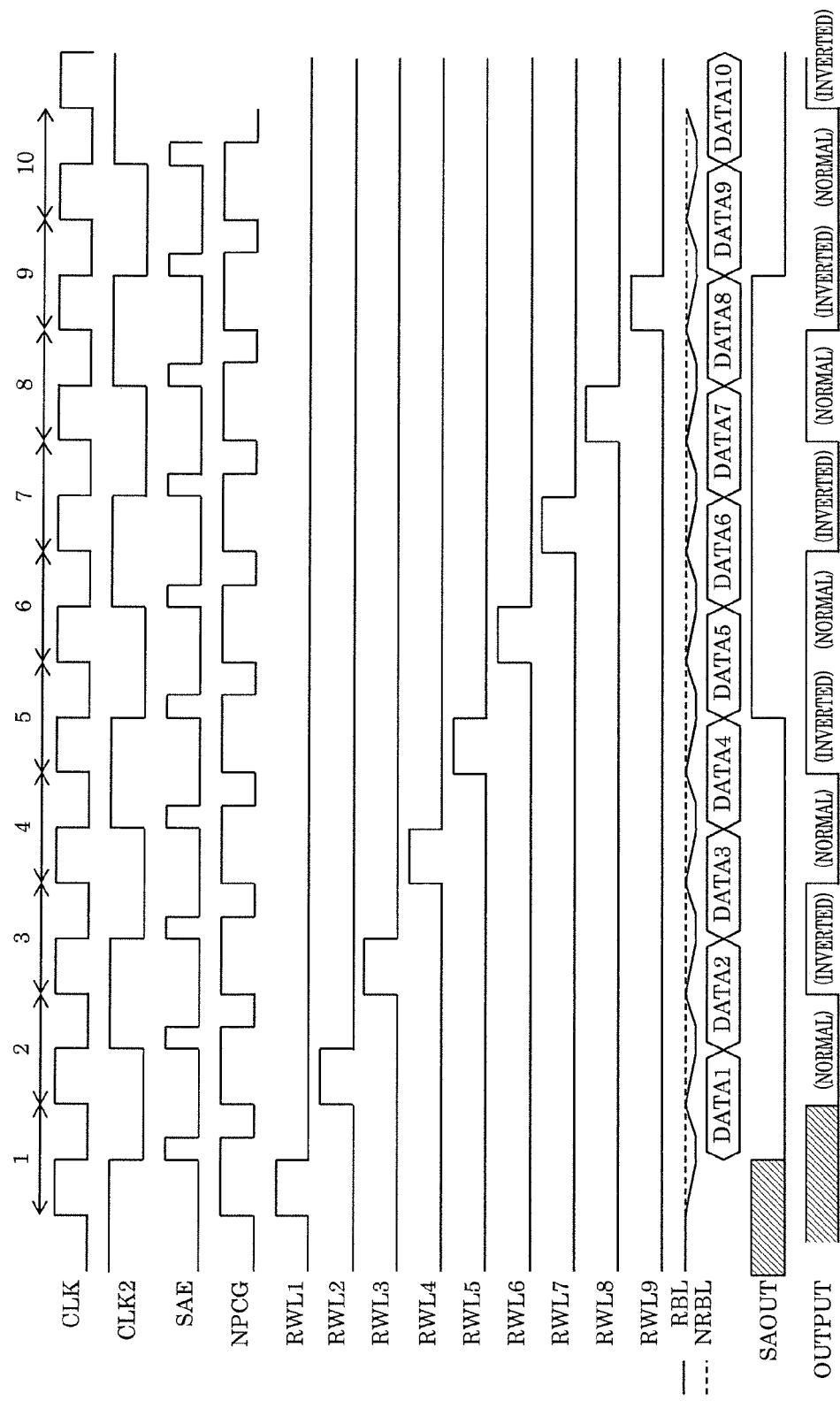
FIG. 4 is a timing chart illustrating a specific example of operations by the data transfer circuit according to Embodiment 1.

FIG. 4 is a timing chart illustrating a specific example of operations by data transfer circuit 110 illustrated in FIGS. 1 to 3. To facilitate understanding of the present disclosure, cycle names of 1 to 10 have been added above clock signal CLK. In FIG. 4, the horizontal axis represents time. Additionally, clock signal CLK is a clock signal serving as a reference for the operations of solid-state imaging device 1000. Clock signal CLK2 has a cycle twice that of clock signal CLK. Sense amplifier enable signal SAE is a signal that, when at high level, enables the output of the n sense amplifiers 210. Precharge signal NPCG is a signal that, when at low level, precharges the n pairs of read bit lines RBL and NRBL of the n precharge circuits 215 to a predetermined potential. Read word lines RWL1 to RWL9 are signals that select first to ninth columns, and are driven by column scanning circuit 300. These indicate nine out of x read word lines RWL1 to RWLx. The pair of read bit lines RBL and NRBL serves as a single representative example of the n pairs of read bit lines RBL and NRBL. DATA1 to DATA10 indicate the timings at which the data output of sense amplifier 210 changes. Sense amplifier output signal SAOUT indicates an output signal from one output buffer 16 among n output buffers 16. Output data OUTPUT indicates one of the n output signals OUTPUT_1 to OUTPUT_n.

Furthermore, the following descriptions will focus on output data OUTPUT_1 (the least significant bit) among the n-bit pixel data.

FIG. 4 assumes that L level is held in storage nodes SN, and H level is held in storage nodes NSN, corresponding to read word lines RWL1, 2, 3, 4, 9, and 10, among the x latch circuits 213 (e.g., corresponding to output data OUTPUT_1). In this case, the corresponding sense amplifier output signal SAOUT is L.

FIG. 4 also assumes that H level is held in storage nodes SN, and L level is held in storage nodes NSN, of latch circuits 213 corresponding to read word lines RWL5, 6, 7, and 8. In this case, the corresponding sense amplifier output signal SAOUT is H.

It is also assumed that prior to cycle 1 in FIG. 4, reset signal RST is activated in order to internally reset column scanning circuit 300. Additionally, precharge signal NPCG is at L level, and read bit lines RBL and NRBL are both precharged to a predetermined potential (e.g., a source potential).

Column scanning circuit 300 is a circuit which carries out scanning that sets read word lines RWL1 to RWLx to H level, one at a time in succession, with each cycle of clock CLK, and sequentially activates RWL1 to RWLx with each H period of clock CLK. This scanning is reset by reset signal RST, and when the reset occurs, the order of the activation of the read word lines is once again set to the order of RWL1, RWL2, and so on up to RWLx. Additionally, timing generation circuit 340 sets sense amplifier enable signal SAE to H level at the falling edge of the clock, and sense amplifier enable signal SAE returns to L level after a predetermined period has passed. When SAE transitions to L level, precharge signal NPCG transitions to L level, and then transitions to H level at the rising edge of clock CLK.

In cycle 1, as described above, the signal of read word line RWL1, output by column scanning circuit 300, is activated to H level during the H period of clock CLK, and transitions to L level when clock CLK falls. When RWL1 is activated to H, driver circuit 214 corresponding to the least significant bit within the n latch driver circuits 209 corresponding to RWL1 discharges a charge in one of the pair of read bit lines RBL and NRBL, in accordance with the value in latch circuit 213. Here, L is stored in storage node SN, as the data in latch circuit 213 corresponding to RWL1, and thus read bit line RBL transitions to L level. On the other hand, NRBL stays at H level.

Sense amplifier enable signal SAE activates to H when clock CLK falls in cycle 1, and as a result, a signal according to the potential states of read bit lines RBL and NRBL is output to sense amplifier output signal SAOUT. In cycle 1, RBL transitions to L level, but NRBL stays at H level, and thus the output signal SAOUT transitions to L level.

In cycle 1, clock CLK2 is at L level, and thus selector circuit 112 selects normal output. In other words, selector circuit 112 outputs 1-bit data, having the same polarity as sense amplifier output signal SAOUT, to flip-flop 111.

After the H period of sense amplifier enable signal SAE has passed for a set time, precharge signal NPCG transitions to L level, and read bit lines RBL/NRBL are precharged in preparation for the operations of cycle 2. At this time, the output level of sense amplifier output signal SAOUT is held at L level.

At the rise of CLK in cycle 2, the signal read out from latch driver circuit 209 in cycle 1 is output, at L level, as output data OUTPUT_1 through flip-flop 111 and output buffer 113.

In cycle 2, the signal of read word line RWL2, output by column scanning circuit 300 after cycle 1, is activated to H level during the H period of clock CLK, and transitions to L level when clock CLK falls. When RWL2 is activated to H, driver circuit 214 within the n latch driver circuits 209 corresponding to RWL2 discharges a charge in the read bit line in accordance with the value in latch circuit 213. Here, L is stored in storage node SN, as the data in latch circuit 213 corresponding to RWL2, and thus read bit line RBL transitions to L level. On the other hand, NRBL stays at H level.

Sense amplifier enable signal SAE activates to H when clock CLK falls in cycle 3, and as a result, a signal according to the potential states of read bit lines is output to sense amplifier output signal SAOUT. In cycle 2, RBL transitions to L level, but NRBL stays at H level, and thus L level is output as sense amplifier output signal SAOUT.

In cycle 2, clock CLK2 is at H level, and thus data having the opposite polarity from sense amplifier output signal SAOUT is input to flip-flop 111.

After the H period of sense amplifier enable signal SAE has passed for a set time, precharge signal NPCG transitions to L level, and read bit lines RBL/NRBL are precharged in preparation for the operations of cycle 3. At this time, the output level of sense amplifier output signal SAOUT is held at L level.

At the rise of CLK in cycle 3, the signal read out from latch driver circuit 209 in cycle 2 is output, at H level, as output data OUTPUT_1 through flip-flop 111 and output buffer 113.

The operations in cycle 3 are the same as in cycle 1, and the operations in cycle 4 are the same as in cycle 2.

In cycle 5, as described above, the signal of read word line RWL5, output by column scanning circuit 300, is activated to H level during the H period of clock CLK, and transitions to L level when clock CLK falls. When RWL5 is activated to H, driver circuit 214 within the n latch driver circuits 209 corresponding to RWL5 discharges a charge in the read bit line in accordance with the value in latch circuit 213. Here, H is stored in storage node SN, as the data in latch circuit 213 corresponding to RWL5, and thus read bit line NRBL transitions to L level. On the other hand, RBL stays at H level.

Sense amplifier enable signal SAE activates to H when clock CLK falls in cycle 6, and as a result, a signal according to the potential states of read bit lines is output to sense amplifier output signal SAOUT. In cycle 5, NRBL transitions to L level, but RBL stays at H level, and thus H level is output as sense amplifier output signal SAOUT.

In cycle 5, clock CLK2 is at L level, and thus data having the same polarity as sense amplifier output signal SAOUT is input to flip-flop 111.

After the H period of sense amplifier enable signal SAE has passed for a set time, precharge signal NPCG transitions to L level, and read bit lines RBL/NRBL are precharged in preparation for the operations of cycle 6. At this time, the output level of sense amplifier output signal SAOUT is held at H level.

At the rise of CLK in cycle 6, the signal read out from latch driver circuit 209 in cycle 5 is output, at H level, as output data OUTPUT_1 through flip-flop 111 and output buffer 113.

In cycle 6, the signal of read word line RWL6, output by column scanning circuit 300 after cycle 5, is activated to H level during the H period of clock CLK, and transitions to L level when clock CLK falls. When RWL6 is activated to H, driver circuit 214 within the n latch driver circuits 209 corresponding to RWL6 discharges a charge in the read bit line in accordance with the value in latch circuit 213. Here, H is stored in storage node SN, as the data in latch circuit 213 corresponding to RWL6, and thus read bit line NRBL transitions to L level. On the other hand, RBL stays at H level.

Sense amplifier enable signal SAE activates to H when clock CLK falls in cycle 7, and as a result, a signal according to the potential states of read bit lines is output to sense amplifier output signal SAOUT. In cycle 6, NRBL transitions to L level, but RBL stays at H level, and thus H level is output as sense amplifier output signal SAOUT.

In cycle 6, clock CLK2 is at H level, and thus data having the opposite polarity from sense amplifier output signal SAOUT is input to flip-flop 111.

After the H period of sense amplifier enable signal SAE has passed for a set time, precharge signal NPCG transitions to L level, and read bit lines RBL/NRBL are precharged in preparation for the operations of cycle 7. At this time, the output level of sense amplifier output signal SAOUT is held at H level.

At the rise of CLK in cycle 7, the signal read out from latch driver circuit 209 in cycle 6 is output, at L level, as output data OUTPUT_1 through flip-flop 111 and output buffer 113.

The operations in cycle 7 are the same as in cycle 5, and the operations in cycle 8 are the same as in cycle 6.

Additionally, the operations in cycle 9 are the same as in cycles 1 and 3, and the operations in cycle 10 are the same as in cycles 2 and 4.

Thereafter, readout based on the pixel data is repeated for x+1 cycles, and the pixel data up to the data corresponding to RWLx is read out as a result.

In the present embodiment, the pixel data corresponding to odd-numbered cycles is read out from flip-flop 111 as normal data, and the pixel data corresponding to even-numbered cycles is read out as inverted data. Image signal processor 1001 switches the data between normal form and inverted form with each cycle. In other words, image signal processor 1001 does not invert the data (leaves the data as-is) in odd-numbered cycles, and inverts the data in even-numbered cycles. Image signal processor 1001 further carries out various types of image processing using this data.

As described thus far, according to the present embodiment, the flip-flops can increase the transition state even when the same data is stored in latch driver circuits 209 corresponding to read word lines RWL1, 2, 3, 4, 9, and 10, and data opposite from the data stored in latch driver circuit 209 corresponding to read word line RWL1 is stored in all latch driver circuits 209 corresponding to read word lines RWL5, 6, 7, and 8.

As described above, in a past solid-state imaging device, after a state in which no current is consumed, the average current consumed over a plurality of cycles will fluctuate greatly, which produces source noise. However, according to this embodiment, the activation rate of flip-flop 111 is increased when the same data continues, which makes it possible to suppress fluctuations in the average current consumed over a plurality of cycles. This in turn makes it possible to improve the image quality.

As described thus far, a solid-state imaging device according to an aspect of the present embodiment includes: latch circuit 213 that holds a digital signal constituting pixel data, the digital signal having 1 bit; driver circuit 214 that outputs the digital signal held in latch circuit 213 to a read bit line pair (RBL, NRBL); sense amplifier 210 connected to the read bit line pair (RBL, NRBL); and selector circuit 112 that selects whether the digital signal to be output from sense amplifier 210 is to be output in normal form or in inverted form.

According to this configuration, when the same pixel data continues, bit changes between the consecutive pixel data can be suppressed, which suppresses fluctuations in the average amount of current consumed by data transfer. As a result, the occurrence of noise can be suppressed, and thus a drop in image quality can be suppressed as well.

Additionally, a solid-state imaging device according to an aspect of the present embodiment includes: pixel array 102 in which a plurality of pixel units 101 that carry out photoelectric conversion are arranged in rows and columns; AD conversion circuit 109 that converts analog signals from the plurality of pixel units 101 into digital signals on a column-by-column basis; a plurality of latch circuits 213 provided on a column-by-column basis and holding the digital signals; a plurality of driver circuits 214 that sequentially output the digital signals held in the plurality of latch circuits on a column-by-column basis; a plurality of read bit line pairs RBL and NRBL respectively connected to the plurality of driver circuits 214; a plurality of sense amplifiers 210 respectively connected to the plurality of read bit line pairs RBL and NRBL; and a plurality of selector circuits 112 that select whether the digital signals output sequentially from the plurality of sense amplifiers 210 are to be output in normal form or in inverted form, on a column-by-column basis.

According to this configuration, when the same pixel data continues, bit changes between the consecutive pixel data can be suppressed, which suppresses fluctuations in the average amount of current consumed by data transfer. As a result, the occurrence of noise can be suppressed, and thus a drop in image quality can be suppressed as well.

Here, AD conversion circuit 109 may convert the analog signals into digital signals each having n bits, n being an integer of 2 or greater; a number of the plurality of latch circuits 213 provided in each of the columns may be n; a number of the plurality of driver circuits 214 provided in each of the columns may be n; as number of the plurality of read bit line pairs that are provided may be n; the plurality of read bit line pairs may be respectively connected to driver circuits 214 that are arranged in a row direction; a number of the plurality of sense amplifiers 210 that are provided may be n; and a number of the plurality of selector circuits 112 that are provided may be n.

According to this configuration, when n-bit pixel data is transferred, the occurrence of noise can be suppressed, and thus a drop in image quality can be suppressed as well.

Here, the plurality of selector circuits 112 may be input with a clock signal having a cycle k times a cycle of an operating clock signal as a selection control signal (where k is an integer of 2 or greater).

According to this configuration, the output can be switched between normal output and inverted output every k columns. In other words, output in which the pixel data of k consecutive columns is output in normal form in succession, and the pixel data of k consecutive columns is then output in inverted form, can be repeated. A change can be imparted on the output data by selecting normal output or inverted output, which makes it possible to suppress a situation where a large amount of noise occurs immediately after the same pixel data has continued.

Here, the solid-state imaging device may include: a plurality of output buffers 113 that output the digital signals output from the plurality of selector circuits 112; and a signal processor that digitally processes the digital signals from the plurality of output buffers 113.

Note that this configuration can be applied not only in a solid-state imaging device, but also as a way to reduce readout noise in a semiconductor storage device that carries out sequential readout.

Embodiment 2

The configuration and operations of a solid-state imaging device according to Embodiment 2 will be described next with reference to the drawings, focusing on the differences from Embodiment 1.

Figure 5:
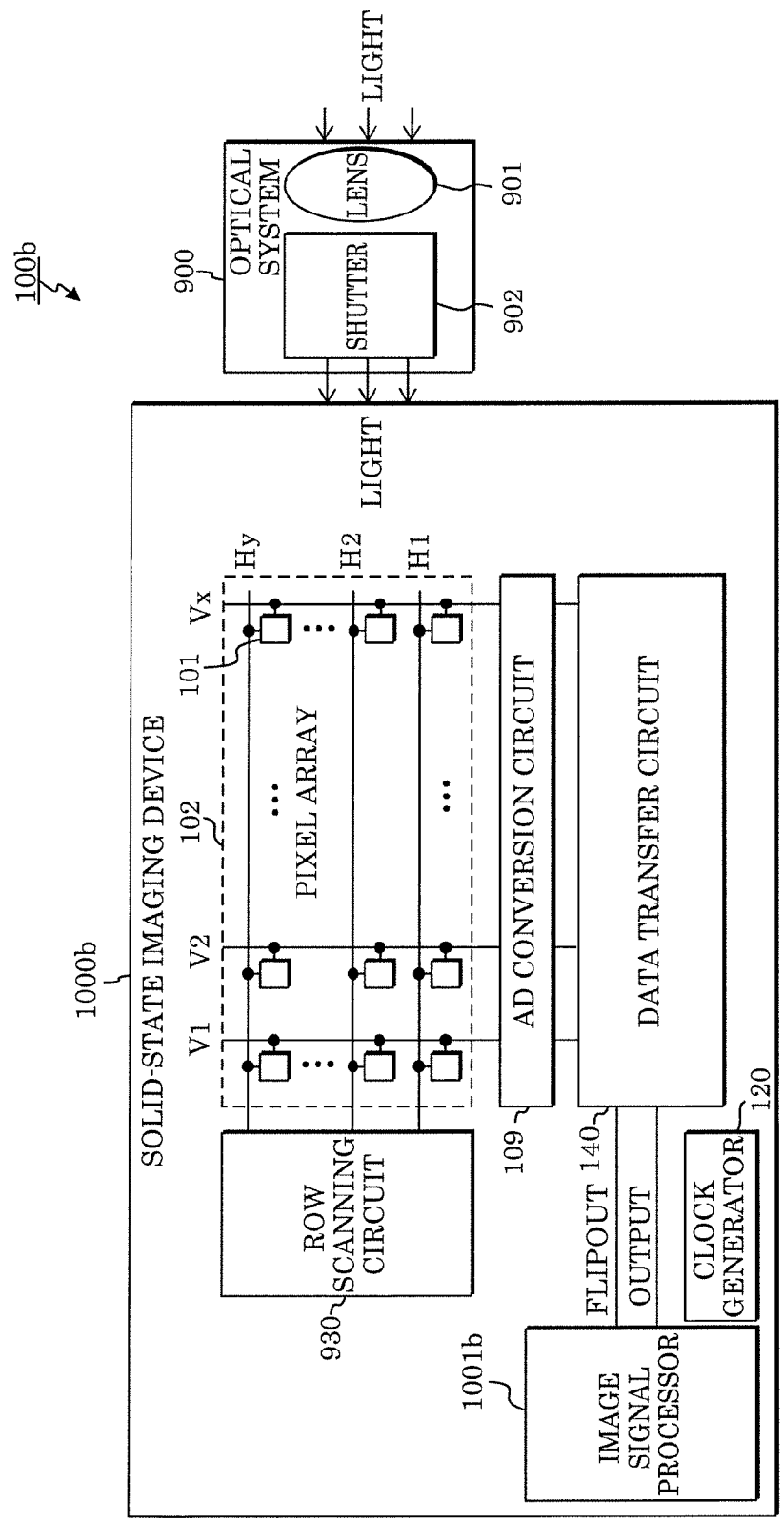
FIG. 5 is a block diagram illustrating an example of the configuration of an image capturing device according to Embodiment 2.

FIG. 5 is a block diagram illustrating the configuration of image capturing device 100b according to Embodiment 2. As illustrated in FIG. 5, image capturing device 100b includes optical system 900 and solid-state imaging device 1000b, and is a camera or a camera module, for example.

Solid-state imaging device 1000b includes pixel array 102, row scanning circuit 930, AD conversion circuit 109, data transfer circuit 140, clock generator 120, and image signal processor 1001b.

Data transfer circuit 140 is a block that outputs output data OUTPUT and inversion recognition signal FLIPOUT.

Image signal processor 1001b is a block that carries out various types of signal processing (image processing) on digital output data OUTPUT and inversion recognition signal FLIPOUT which have been output by data transfer circuit 140.

The configurations aside from data transfer circuit 140 and image signal processor 1001b are the same as in image capturing device 100 according to Embodiment 1.

Figure 6:
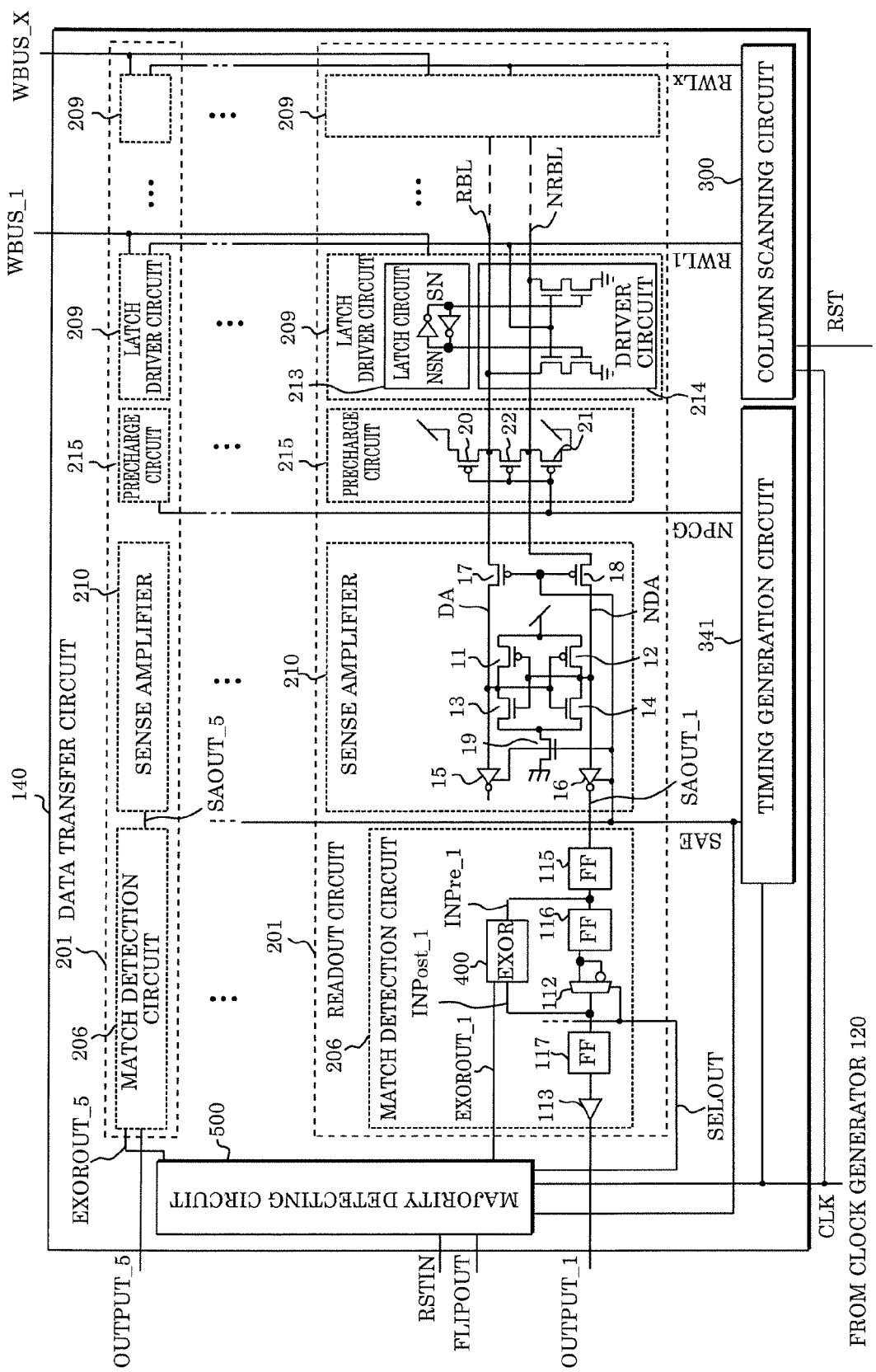
FIG. 6 is a circuit diagram illustrating an example of the configuration of a data transfer circuit according to Embodiment 2 in detail.

FIG. 6 is a circuit diagram illustrating an example of the configuration of data transfer circuit 140 according to Embodiment 2 of the present disclosure in detail.

FIG. 6 illustrates data transfer circuit 140 of FIG. 5 in detail. As illustrated in FIG. 1, x pixels are arranged in the horizontal direction. As such, data transfer circuit 140 illustrated in FIG. 6 includes x latch driver circuits 209 in the horizontal direction, and is constituted by readout circuit 201, majority detecting circuit 500, timing generation circuit 341, and column scanning circuit 300. Readout circuit 201 includes precharge circuit 215, sense amplifier 210, selector circuit 112, flip-flops 115, 116, and 117, output buffer 113, and match detection circuit 206.

Sense amplifier 210, precharge circuit 215, latch driver circuit 209, and column scanning circuit 300 described in Embodiment 1 with reference to FIG. 3 are the same as in Embodiment 1.

Timing generation circuit 341 illustrated in FIG. 6 is configured omitting the output of clock CLK2 from timing generation circuit 340 illustrated in FIG. 3.

Match detection circuit 206, which takes the output from sense amplifier 210 as an input, is constituted by a plurality of flip-flops 115, 116, and 117, exclusive OR circuit 400, and selector circuit 112, with the two flip-flops 115 and 116 have a cascading connection. The output of flip-flop 116 is connected to an input of selector circuit 112.

Exclusive OR circuit 400 operates as a comparing circuit which compares a first digital signal, corresponding to a digital signal output sequentially from sense amplifier 210, with a second digital signal output in the next cycle. A result of the comparison is output as exclusive OR signal EXOROUT, indicating whether or not there is a match. Specifically, exclusive OR circuit 400 takes the output of selector circuit 112 and the output of flip-flop 115 as inputs, and outputs exclusive OR signal EXOROUT. The output from exclusive OR circuit 400 is connected to the input of majority detecting circuit 500, and the output of majority detecting circuit 500 is connected to the select signal from selector circuit 112. The output of selector circuit 112 is connected to the input of flip-flop 117 and the input of output buffer 113.

Note that data transfer circuit 140 is assumed to be constituted by five readout circuits 201.

Exclusive OR circuit 400 has two inputs, namely INpre and InPost, and is a circuit that outputs EXOROUT. When INpre and InPost are different input levels (H level or L level), H level is output as EXOROUT.

Note that in FIG. 6, INpre, InPost, and EXOROUT of exclusive OR circuit 400 are given suffixes of 1 to 5, corresponding to the respective readout circuits 201.

Majority detecting circuit 500 is a circuit that takes exclusive OR signals EXOROUT_1 to EXOROUT_5 output from readout circuits 201, reset signal RSTIN, clock CLK, and sense amplifier enable signal SAE as inputs, outputs selection control signal SELOUT at H level when the total number of EXOROUT_1 to 5 at H level is 3 or more (a Hamming distance of 3), and outputs selection control signal SELOUT at L level when the total number of EXOROUT_1 to 5 at H level is 2 or fewer (a Hamming distance of 2).

Figure 7A:
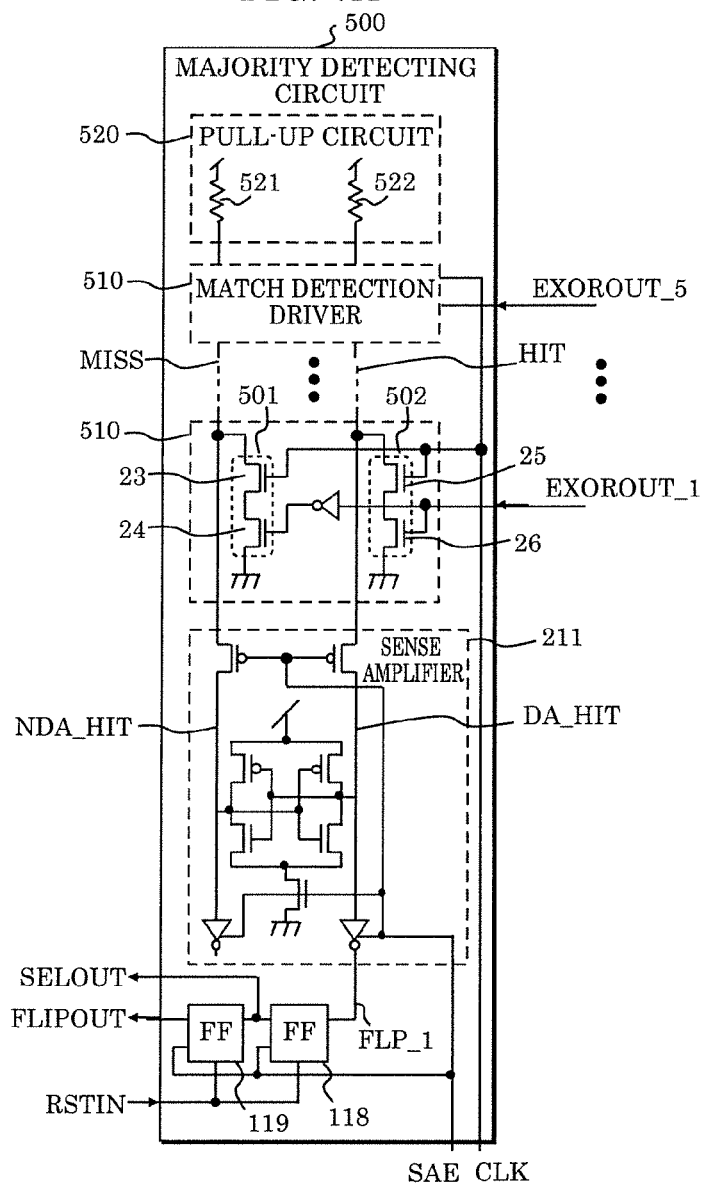
FIG. 7A is a circuit diagram illustrating an example of the configuration of a majority detecting circuit according to Embodiment 2 in detail.
Figure 7B:
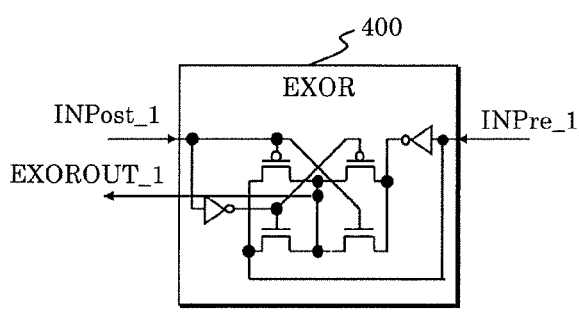
FIG. 7B is a circuit diagram illustrating an example of the configuration of an exclusive OR circuit.

FIG. 7A is a circuit diagram illustrating an example of the configuration of majority detecting circuit 500 in detail. FIG. 7B is a circuit diagram illustrating an example of the configuration of exclusive OR circuit 400.

Note that as in FIG. 6, in FIG. 7A, INpre, InPost, and EXOROUT of exclusive OR circuit 400 are given suffixes of 1 to 5, corresponding to the respective readout circuits 201.

Majority detecting circuit 500 is constituted by sense amplifier 211, five match detection drivers 510, pull-up circuit 520, and flip-flops 118 and 119. Pull-up circuit 520 is connected to detection node (MISS) and detection node (HIT), as well as the five match detection drivers 510 and sense amplifier 211. States of potentials at detection node (MISS) and detection node (HIT) are determined by the signal states of EXOROUT_1 to EXOROUT_5, with the potential of detection node (HIT) falling below the potential of detection node (MISS) when three or more of the 5-bit EXOROUT_1 to EXOROUT_5 are at H level, and the potential of detection node (MISS) falling below the potential of detection node (HIT) when two or fewer of the 5-bit EXOROUT_1 to EXOROUT_5 are at H level.

The potential relationship between detection node (HIT) and detection node (MISS) is amplified by sense amplifier 211 in a later stage and output to FLIP_I. Having received the output, FLIP_I outputs inversion recognition signal FLIPOUT through the two cascade-connected flip-flops 118 and 119.

Flip-flops 118 and 119 update the respective data at the rise of clock CLK.

Data transfer circuit 140 will be described with reference to the circuit diagrams in FIGS. 6, 7A, and 7B, the state tables in FIGS. 8, 9, and 10, and the waveform diagram in FIG. 11.

In the present embodiment, as in the previous embodiment, the writing of pixel data from counter circuit 208 to latch circuit 213 is not illustrated, and the descriptions assume that the pixel data described later is held in latch circuit 213.

FIG. 8 is a diagram illustrating an example of pixel data corresponding to RWL1, 2, 3, 4, 5, and 6. This pixel data example indicates the states of storage nodes SN in the n (n=5 in the present embodiment) latch circuits 213 corresponding to the aforementioned RWL1 to 6, respectively.

The data is 5-bit data, with the data in the five latch circuits 213 corresponding to RWL1 all being at L level in accordance with DATA1, and the data in the five latch circuits 213 corresponding to RWL2 all being at H level in accordance with DATA2. It is assumed that the data of DATA3, 4, 5, and 6 indicated in FIG. 8 is stored in RWL3, 4, 5, and 6 as well.

Figure 11:
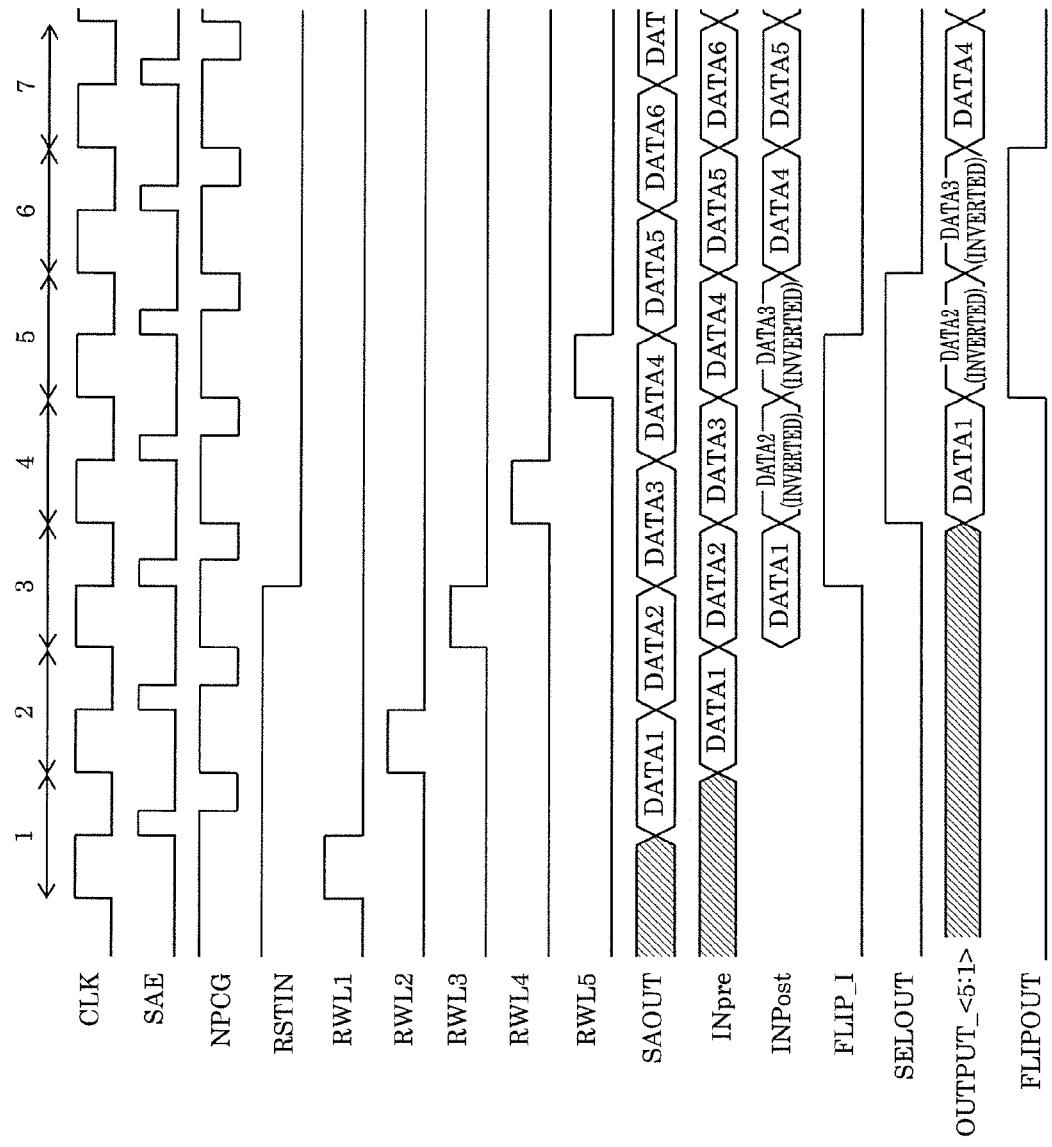
FIG. 11 is a timing chart illustrating an example of operations according to Embodiment 2.

FIG. 11 is a timing chart illustrating a specific example of operations by data transfer circuit 140 illustrated in FIGS. 5 and 6. To facilitate understanding of the present disclosure, cycle names of 1 to 7 have been added above clock signal CLK.

It is also assumed that prior to cycle 1, reset signal RST is activated in order to internally reset column scanning circuit 300. Additionally, precharge signal NPCG is at L level, and read bit lines RBL and NRBL are both precharged to a source potential.

The operations of column scanning circuit 300 pertaining to readout are the same as in Embodiment 1. Additionally, the operations of sense amplifier enable signal SAE and precharge signal NPCG output by timing generation circuit 341 are the same as those in timing generation circuit 340 according to Embodiment 1.

Note that column scanning circuit 300 and timing generation circuit 341 are not illustrated in detail.

Flip-flops 115, 116, and 117 of match detection circuit 206 take in data at the rise of CLK and output the input data at the next rise of CLK.

In cycle 1, all the pixel data is at L as indicated in FIG. 8. As such, an L-level signal (DATA1) is output from sense amplifier output signals SAOUT_1 to SAOUT_5 between the fall of the clock and the fall of clock CLK in the next cycle, as illustrated in FIG. 11.

At the rise of CLK in cycle 2, DATA1 read out from the sense amplifier output in the previous cycle is output to InPre via flip-flop 115, and is held for the duration of cycle 2, as indicated in FIG. 11.

Additionally, in cycle 2, all the pixel data is at H as indicated in FIG. 8. As such, an H-level signal (DATA2) is output from sense amplifier output signals SAOUT_1 to SAOUT_5 between the fall of the clock and the fall of clock CLK in the next cycle.

At the rise of CLK in cycle 3, DATA2 read out from the sense amplifier output in the previous cycle is output to InPre via flip-flop 115, and is held for the duration of cycle 3, as indicated in FIG. 11.

Additionally, at the rise of CLK in cycle 3, DATA1 read out from the output of flip-flop 115 in the previous cycle is output to InPost via flip-flop 116 and selector circuit 112, and is held for the duration of cycle 3.

At this time, selection control signal SELOUT of selector circuit 112 is at L level from cycles 1 to 3 due to reset signal RSTIN supplied to majority detecting circuit 500 from the exterior being activated throughout cycles 1, 2, and 3.

In cycle 3, DATA<5:1> of the pixel data is 01011, as illustrated in FIG. 8. As such, the sense amplifier outputs are as follows leading up to the clock falling in cycle 3: H is output for SAOUT_1; H is output for SAOUT_2; L is output for SAOUT_3; H is output for SAOUT_4; and L is output for SAOUT_5 (DATA3).

In cycle 3, exclusive OR circuit 400 outputs an exclusive OR result of the bits of DATA1 and DATA2, as described earlier. Because DATA1 and DATA2 are in an inverted state for all five bits, H level is output for all of exclusive OR signals EXOROUT_1 to _5.

At this time, in majority detecting circuit 500, Nch transistors 502, which, of Nch transistor pairs 501 and 502 in match detection drivers 510 within majority detecting circuit 500, are connected to a HIT node, are grounded, and the potential of the HIT node drops accordingly, while clock CLK is at H level, as illustrated in FIG. 7A.

When clock CLK falls in cycle 3, sense amplifier enable signal SAE rises, and because the potential at the HIT node is lower than the potential at a MISS node, the potential at DA_HIT connected to the sense amplifier transitions to L level.

Accordingly, the potential of inversion flag FLIP_I transitions to H level, and the output of inversion flag FLIP_I is held until the rise of sense amplifier enable signal SAE in the next cycle.

At the rise of the clock in cycle 4, DATA1, which had been held in InPost in the previous cycle, is output as output data OUTPUT_1 to 5 via flip-flop 117 and output buffer 113, and is held for the duration of that cycle.

Additionally, in cycle 4, H level for inversion flag FLIP_I, output in the previous cycle, is output at H level as selection control signal SELOUT when CLK rises, and is held for the duration of that cycle.

At the rise of CLK in cycle 4, DATA3 read out from the sense amplifier output in the previous cycle is output to InPre via flip-flop 115, and is held for the duration of cycle 4, as indicated in FIG. 11.

Additionally, at the rise of CLK in cycle 4, DATA2 read out from the output of flip-flop 115 in the previous cycle is output to InPost via flip-flop 116 and selector circuit 112, and is held for the duration of cycle 4.

At this time, H level for inversion flag FLIP_I, output in the previous cycle, is output at H level as selection control signal SELOUT when CLK rises, and is held for the duration of that cycle. As such, selector circuit 112 outputs an inverted signal for flip-flop 116. In other words, an inverted signal of DATA2 is output to INPost.

In that cycle, two signals, namely the inverted signal of DATA2 output to INPost and the signal of DATA3 output to INPre, are input to exclusive OR circuit 400, and a detection of a match or a mismatch is carried out for each bit. At this time, EXOROUT<5:1> is 01011.

At this time, of Nch transistor pairs 501 and 502 in match detection drivers 510 within majority detecting circuit 500, two of Nch transistor pairs 501 connected to the MISS node, and three of Nch transistor pairs 502 connected to the HIT node, are connected to ground, while clock CLK is at H level, as illustrated in FIG. 7A.

In this case, the potential at both the MISS and HIT nodes drops, but the potential at the HIT node, which has a higher number of Nch transistor pairs that are grounded, is lower than the potential at the MISS node.

When clock CLK falls in cycle 4, sense amplifier enable signal SAE rises, and because the potential at the HIT node is lower than the potential at the MISS node, the potential at DA_HIT connected to the sense amplifier transitions to L level.

Accordingly, the potential of inversion flag FLIP_I transitions to H level, and the output of inversion flag FLIP_I is held until the rise of sense amplifier enable signal SAE in the next cycle.

At the rise of clock CLK in cycle 5, the inverted signal of DATA2, which had been held in InPost in the previous cycle, is output as output data OUTPUT_1 to 5 via flip-flop 117 and output buffer 113, and is held for the duration of that cycle.

Additionally, at the rise of clock CLK in cycle 5, the H level output of selection control signal SELOUT selected in the previous cycle is output at H level via flip-flop 119, and is held for the duration of that cycle.

Additionally, in cycle 5, H level for inversion flag FLIP_I, output in the previous cycle, is output at H level as selection control signal SELOUT when CLK rises, and is held for the duration of that cycle.

At the rise of CLK in cycle 5, DATA4 read out from the sense amplifier output in the previous cycle is output to InPre via flip-flop 115, and is held for the duration of cycle 5, as indicated in FIG. 11.

Additionally, at the rise of CLK in cycle 5, DATA3 read out from the output of flip-flop 115 in the previous cycle is output to InPost via flip-flop 116 and selector circuit 112, and is held for the duration of cycle 5.

At this time, H level for inversion flag FLIP_I, output in the previous cycle, is output at H level as selection control signal SELOUT when CLK rises, and is held for the duration of that cycle. As such, selector circuit 112 outputs an inverted signal for flip-flop 116. In other words, an inverted signal of DATA3 is output to INPost.

In that cycle, two signals, namely the inverted signal of DATA3 output to INPost and the signal of DATA4 output to INPre, are input to exclusive OR circuit 400, and a detection of a match or a mismatch is carried out for each bit. At this time, EXOROUT<5:1> is 10000.

At this time, of Nch transistors 501 and 502 in match detection driver 510 within majority detecting circuit 500, four of Nch transistor pairs 501 connected to the MISS node, and one of Nch transistor pairs connected to the HIT node, are grounded, while clock CLK is at H level, as illustrated in FIG. 7A.

In this case, the potential at both the MISS and HIT nodes drops, but the potential at the MISS node, which has a higher number of Nch transistor pairs that are grounded, is lower than the potential at the HIT node.

When clock CLK falls in cycle 5, sense amplifier enable signal SAE rises, and because the potential at the MISS node is lower than the potential at the HIT node, the potential at DA_HIT connected to the sense amplifier transitions to H level.

Accordingly, the potential of inversion flag FLIP_I transitions to L level, and the output of inversion flag FLIP_I is held until the rise of sense amplifier enable signal SAE in the next cycle.

At the rise of the clock in cycle 6, the inverted signal of DATA3, which had been held in InPost in the previous cycle, is output as output data OUTPUT_1 to 5 via flip-flop 117 and output buffer 113, and is held for the duration of that cycle.

Additionally, at the rise of clock CLK in cycle 6, the H level output of selection control signal SELOUT selected in the previous cycle is output at H level via flip-flop 119, and is held for the duration of that cycle.

Additionally, in cycle 6, L level for inversion flag FLIP_I, output in the previous cycle, is output at L level as selection control signal SELOUT when CLK rises, and is held for the duration of that cycle.

At the rise of CLK in cycle 6, DATA5 read out from the sense amplifier output in the previous cycle is output to InPre via flip-flop 115, and is held for the duration of cycle 6, as indicated in FIG. 11.

Additionally, at the rise of CLK in cycle 6, DATA4 read out from the output of flip-flop 115 in the previous cycle is output to InPost via flip-flop 116 and selector circuit 112, and is held for the duration of cycle 6.

At this time, L level for inversion flag FLIP_I, output in the previous cycle, is output at L level as selection control signal SELOUT when CLK rises, and is held for the duration of that cycle. As such, selector circuit 112 outputs the signal of flip-flop 116 as-is. In other words, the signal of DATA4 is output to INPost.

In that cycle, two signals, namely the signal of DATA4 output to INPost and the signal of DATA5 output to INPre, are input to exclusive OR circuit 400, and a detection of a match or a mismatch is carried out for each bit. At this time, EXOROUT<5:1> is 11000.

At this time, of Nch transistors 501 and 502 in match detection driver 510 within majority detecting circuit 500, three of Nch transistor pairs 501 connected to the MISS node, and two of Nch transistor pairs connected to the HIT node, are grounded, while clock CLK is at H level, as illustrated in FIG. 7A.

In this case, the potential at both the MISS and HIT nodes drops, but the potential at the MISS node, which has a higher number of Nch transistor pairs that are grounded, is lower than the potential at the HIT node.

When clock CLK falls in cycle 6, sense amplifier enable signal SAE rises, and because the potential at the MISS node is lower than the potential at the HIT node, the potential at DA_HIT connected to the sense amplifier transitions to H level.

Accordingly, the potential of inversion flag FLIP_I transitions to L level, and the output of inversion flag FLIP_I is held until the rise of sense amplifier enable signal SAE in the next cycle.

At the rise of the clock in cycle 7, the signal of DATA4, which had been held in InPost in the previous cycle, is output as output data OUTPUT_1 to 5 via flip-flop 117 and output buffer 113, and is held for the duration of that cycle.

Additionally, at the rise of clock CLK in cycle 7, the L level output of selection control signal SELOUT selected in the previous cycle is output at L level via flip-flop 119, and is held for the duration of that cycle.

Additionally, in cycle 7, L level for inversion flag FLIP_I, output in the previous cycle, is output at L level as selection control signal SELOUT when CLK rises, and is held for the duration of that cycle.

At the rise of CLK in cycle 7, DATA6 read out from the sense amplifier output in the previous cycle is output to InPre via flip-flop 115, and is held for the duration of cycle 7, as indicated in FIG. 11.

Additionally, at the rise of CLK in cycle 7, DATA5 read out from the output of flip-flop 115 in the previous cycle is output to InPost via flip-flop 116 and selector circuit 112, and is held for the duration of cycle 7.

At this time, L level for inversion flag FLIP_I, output in the previous cycle, is output at L level as selection control signal SELOUT when CLK rises, and is held for the duration of that cycle. As such, selector circuit 112 outputs the signal of flip-flop 116 as-is. In other words, the signal of DATA5 is output to INPost.

In that cycle, two signals, namely the signal of DATA5 output to INPost and the signal of DATA6 output to INPre, are input to exclusive OR circuit 400, and a detection of a match or a mismatch is carried out for each bit. At this time, EXOROUT<5:1> is 00100.

At this time, of Nch transistors 501 and 502 in match detection driver 510 within majority detecting circuit 500, four of Nch transistor pairs 501 connected to the MISS node, and one of Nch transistor pairs connected to the HIT node, are grounded, while clock CLK is at H level, as illustrated in FIG. 7A.

In this case, the potential at both the MISS and HIT nodes drops, but the potential at the MISS node, which has a higher number of Nch transistor pairs that are grounded, is lower than the potential at the HIT node.

When clock CLK falls in cycle 6, sense amplifier enable signal SAE rises, and because the potential at the MISS node is lower than the potential at the HIT node, the potential at DA_HIT connected to the sense amplifier transitions to H level.

Accordingly, the potential of inversion flag FLIP_I transitions to L level, and the output of inversion flag FLIP_I is held until the rise of sense amplifier enable signal SAE in the next cycle.

The readout of the x columns of pixel data is carried out thereafter for cycles 8 to x+3.

FIG. 9 is a diagram illustrating input states of the exclusive OR circuit, and output states of the inversion flag, in cycles 3 to 7, according to Embodiment 2. In FIG. 9, the InPre data and InPost data from cycles 3 to 7 are indicated as the input states.

In cycle 3, all of the five bits input to DATA1 of exclusive OR input INPost and DATA2 of exclusive OR input INPre are different. The Hamming distance is therefore 5, and in majority detecting circuit 500, H level is output for FLIP_I in that cycle.

In cycle 4, H level was output for FLIP_I in the previous cycle, and thus majority detecting circuit 500 compares the inverted DATA2 of exclusive OR input INPost with DATA3 of exclusive OR input INPre. The Hamming distance of the 5-bit data is 3, and thus in majority detecting circuit 500, H level is output for FLIP_I in that cycle.

In cycle 5, H level was output for FLIP_I in the previous cycle, and thus majority detecting circuit 500 compares the inverted DATA3 of exclusive OR input INPost with DATA4 of exclusive OR input INPre. The Hamming distance of the 5-bit data is 1, and thus in majority detecting circuit 500, L level is output for FLIP_I in that cycle.

In cycle 6, L level was output for FLIP_I in the previous cycle, and thus majority detecting circuit 500 compares the DATA4 of exclusive OR input INPost with DATA5 of exclusive OR input INPre. The Hamming distance of the 5-bit data is 2, and thus in majority detecting circuit 500, L level is output for FLIP_I in that cycle.

In cycle 7, L level was output for FLIP_I in the previous cycle, and thus majority detecting circuit 500 compares the DATA5 of exclusive OR input INPost with DATA6 of exclusive OR input INPre. The Hamming distance of the 5-bit data is 1, and thus in majority detecting circuit 500, L level is output for FLIP_I in that cycle.

FIG. 10 is a diagram illustrating output states of data transfer circuit 140 in cycles 4 to 8, according to Embodiment 2. FIG. 10 illustrates the states of output data OUTPUT_<5:1> and inversion recognition signal FLIPOUT output by data transfer circuit 140 from cycle 4 to cycle 8.

In cycle 4, the data of DATA1 and L level for FLIPOUT are output for output data OUTPUT_<5:1>. In cycle 5, the inverted data of DATA2 and H level for FLIPOUT are output for output data OUTPUT_<5:1>.

In cycle 6, the inverted data of DATA3 and H level for FLIPOUT are output for output data OUTPUT_<5:1>.

In cycle 7, the data of DATA4 and H level for FLIPOUT are output for output data OUTPUT_<5:1>.

In cycle 8, the data of DATA5 and H level for FLIPOUT are output for output data OUTPUT_<5:1>.

As described thus far, according to the present embodiment, in the readout of the 5-bit pixel data, outputting the output data in an inverted state when the pixel data has a Hamming distance of 3 or more in the next cycle makes it possible to reduce the probability of transitions in the data output from data transfer circuit 140. As illustrated in FIG. 10, the signals corresponding to pixels are output at a latency of 3, along with FLIPOUT. At this time, comparing a given output data OUTPUT with the output data OUTPUT from the previous and following cycles, it can be seen that the Hamming distance is never greater than 3.

Additionally, the image signal processor which adds and outputs inversion recognition signal FLIPOUT may determine whether the data transferred to the image signal processor is normal data or inverted data by referring to the FLIPOUT signal, and then decode that data into the original pixel data.

Although the present embodiment describes the bit width of the data as being 5 bits for explanatory purposes, the bit width is not limited thereto. When the data transfer circuit has a bit width of n, the maximum Hamming distance for the data output in the previous and following cycles can be kept to no greater than n/2. As such, major effects in reducing current consumption and noise can be achieved in a large-format sensor or the like which has a large bit width and places a large load on the lines from the data transfer circuit to the image signal processor.

As described thus far, a solid-state imaging device according to an aspect of the present embodiment further includes a comparing circuit (i.e., exclusive OR circuit 400) that compares a first digital signal with a second digital signal, the first digital signal and the second digital signal being ones of the digital signal output from sense amplifier 210 in successive cycles, and the second digital signal being output in a next cycle after a cycle in which the first digital signal is output, and selector circuit 112 selects whether to output the digital signal in normal form or in inverted form in accordance with a comparison result from the comparing circuit.

According to this configuration, even when the successive first digital signal and second digital signal have different values, bit changes can be suppressed in the output from selector circuit 112, which suppresses fluctuations in the average amount of current consumed by data transfer. As a result, the occurrence of noise can be suppressed, and thus a drop in image quality can be suppressed as well.

The solid-state imaging device according to an aspect of the present embodiment includes: a plurality of exclusive OR circuits 400 that compare, on a bit-by-bit basis, first pixel data with second pixel data, the first pixel data and the second pixel data being ones of the digital signals output from the plurality of sense amplifiers 210 in successive cycles; and majority detecting circuit 500 that detects a majority decision result based on a total number of mismatches in comparison results from the plurality of exclusive OR circuits 400. The plurality of selector circuits 112 select whether to output in normal form or in inverted form in accordance with the majority decision result.

According to this configuration, by suppressing bit changes between the consecutive pixel data, fluctuations in the average amount of current consumed by data transfer can be suppressed. As a result, the occurrence of noise can be suppressed, and thus a drop in image quality can be suppressed as well.

Here, when the majority decision result is true, the plurality of selector circuits 112 output the digital signals in inverted form.

Here, when the majority decision result is false, the plurality of selector circuits 112 output the digital signals in normal form.

Here, majority detecting circuit 500 outputs a signal indicating the majority decision result, as signal FLIPOUT indicating whether the digital signal is inverted or normal, at the same time as the digital signal.

According to this configuration, a process for finalizing the value of the digital signal can be carried out easily using the signal indicating whether the digital signal is inverted or normal.

Here, majority detecting circuit 500 may include: a plurality of match detection drivers 510 corresponding to the plurality of exclusive OR circuits 400; a first line (HIT) that is pulled up to a predetermined potential via a first resistance element (521); a second line (MISS) that is pulled up to the predetermined potential via a second resistance element (522); and a detection circuit (i.e., sense amplifier 211) connected to the first line and the second line. Each of the plurality of match detection drivers 510 may lower a potential of the first line when the comparison result from the corresponding exclusive OR circuit 400 indicates a mismatch, and may lower a potential of the second line when the comparison result from the corresponding exclusive OR circuit 400 indicates a match, and when the potential of the first line is lower than the potential of the second line, the detection circuit (i.e., sense amplifier 211) may detect that the majority decision result is true, and when the potential of the first line is higher than the potential of the second line, the detection circuit (i.e., sense amplifier 211) may detect that the majority decision result is false.

According to this configuration, a simple circuit configuration that detects the majority decision result as a difference between the potentials of the first line and the second line can be realized.

Here, each of the plurality of match detection drivers 510 may include first transistor pair 502 cascode-connected between the first line and a ground, and second transistor pair 501 cascode-connected between the second line and a ground. A signal indicating the comparison result from a corresponding exclusive OR circuit 400 may be input to a gate of one transistor 26 constituting first transistor pair 502, and a signal indicating an inverted form of the comparison result from a corresponding exclusive OR circuit 400 may be input to a gate of one transistor 25 constituting second transistor pair 501.

According to this configuration, the match detection driver can be constituted by four transistors and one inverting circuit.

The present embodiment describes a configuration where a majority decision is made for all bit widths of the output data from the pixels. However, it should be noted that power can be further optimized by, for example, taking the pixel data at a bit width of n, making a majority decision for each instance of the most significant n/2 bits and the least significant n/2 bits of readout data, and giving each instance of output data an inversion recognition signal.

Embodiment 3

The configuration and operations of a solid-state imaging device according to Embodiment 3 will be described next with reference to the drawings, focusing on the differences from Embodiments 1 and 2.

Figure 12:
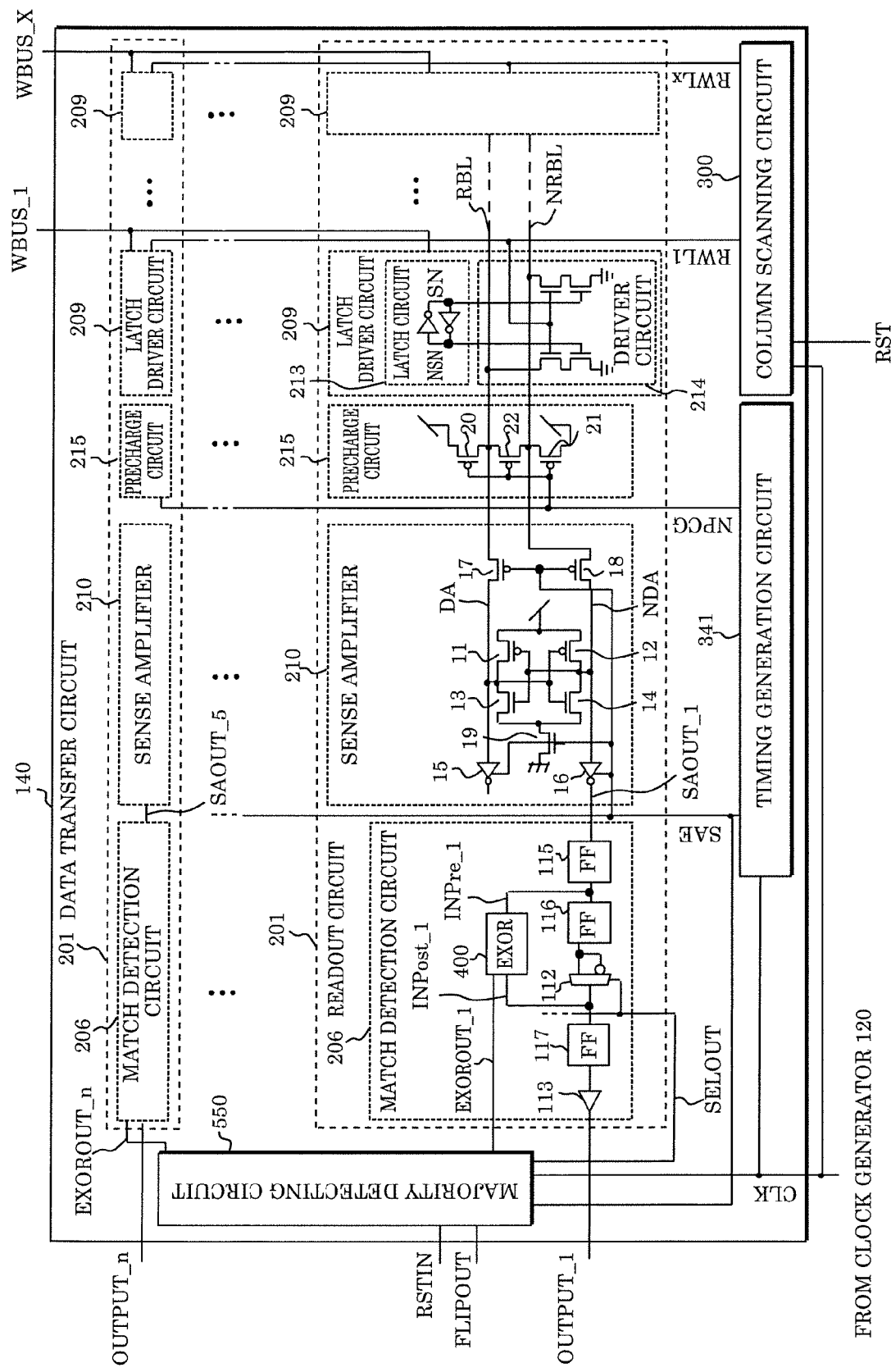
FIG. 12 is a circuit diagram illustrating an example of the configuration of a data transfer circuit according to Embodiment 3 in detail.
Figure 13A:
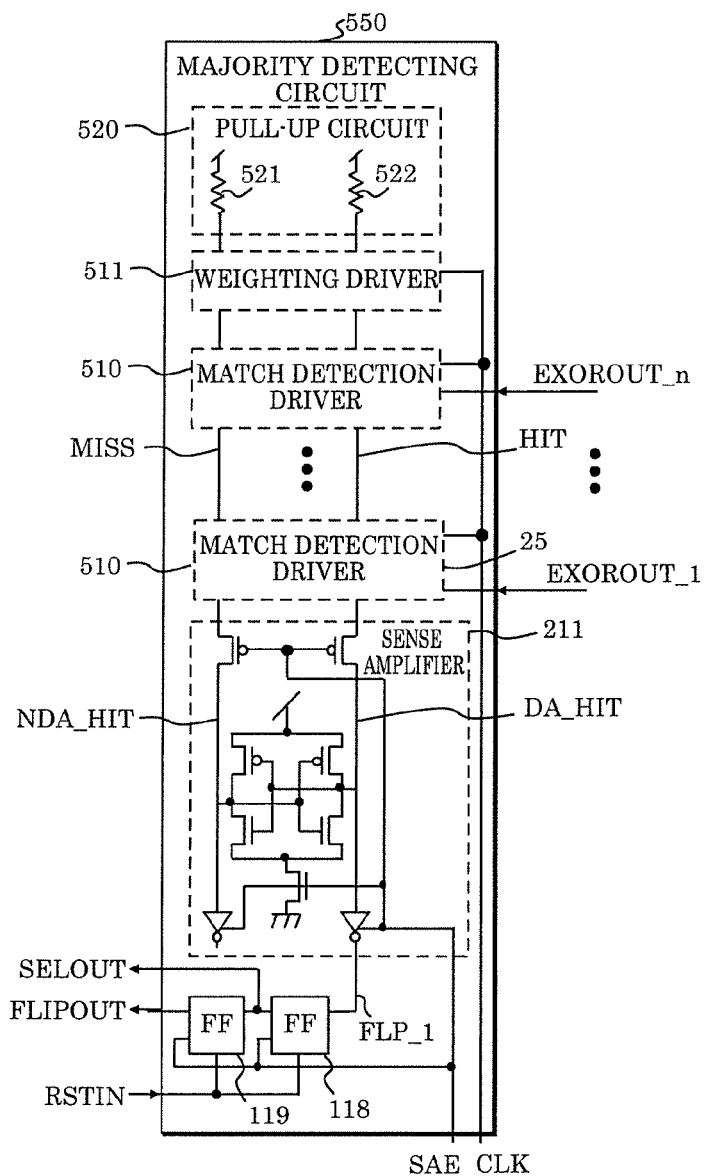
FIG. 13A is a circuit diagram illustrating an example of the configuration of a majority detecting circuit according to Embodiment 3 in detail.
Figure 13B:
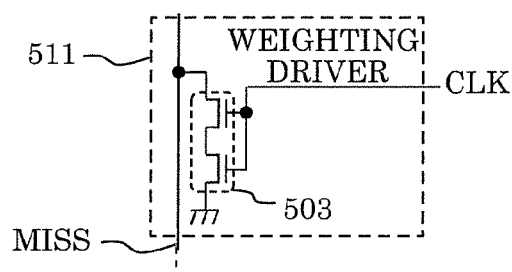
FIG. 13B is a circuit diagram illustrating an example of the configuration of a weighting driver illustrated in FIG. 13A.
Figure 14:
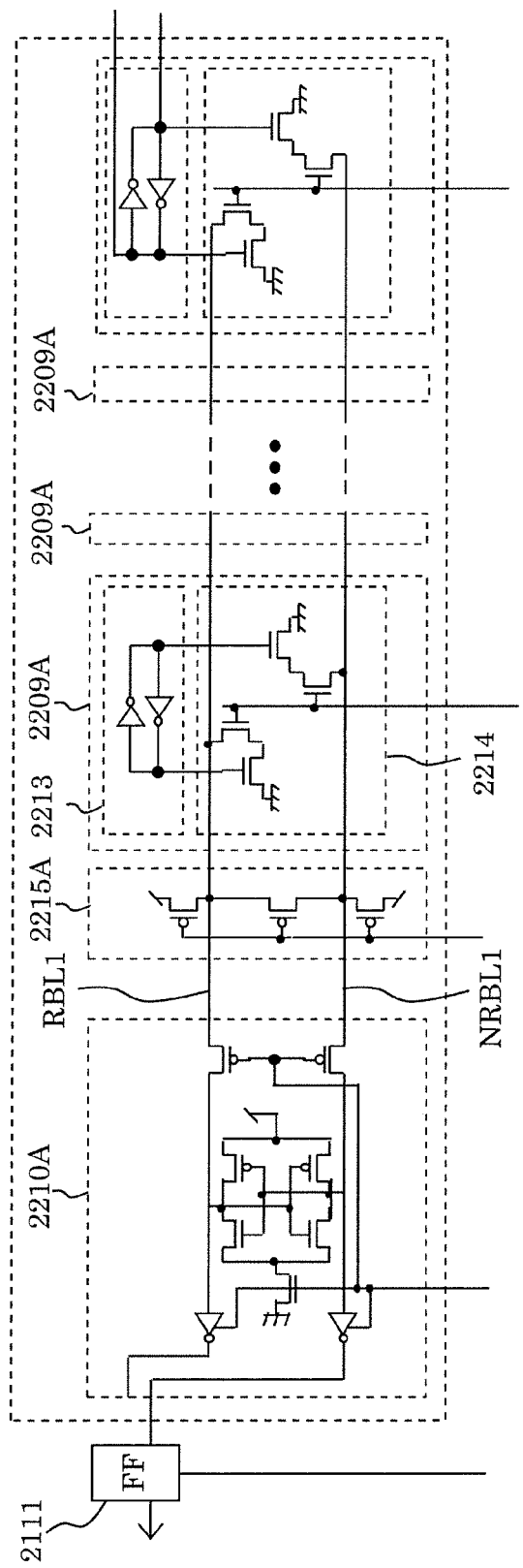
FIG. 14 is a diagram illustrating the configuration of a data transfer circuit used in an MOS sensor disclosed in International Publication No. WO2015/111368.

FIG. 12 is a diagram illustrating an example of the configuration of data transfer circuit 140 according to Embodiment 3 of the present disclosure in detail. FIG. 13A is a circuit diagram illustrating an example of the configuration of majority detecting circuit 550 according to Embodiment 3. FIG. 13B is a circuit diagram illustrating an example of the configuration of weighting driver 511 illustrated in FIG. 13A.

Data transfer circuit 140 illustrated in FIG. 12 differs from that of FIG. 6 primarily in that the pixel data is n-bit rather than 5-bit, and that majority detecting circuit 550 is provided instead of majority detecting circuit 500. The following descriptions will focus upon these differences.

Majority detecting circuit 550 is configured so that even when n (bits) is an even number, a case where the majority decision results in a tie is forcibly changed to a majority decision result that is not a tie.

Majority detecting circuit 550 illustrated in FIG. 13A differs from that illustrated in FIG. 7A in that the bit number is n instead of 5, and that weighting driver 511 has been added.

Weighting driver 511 is a weighting circuit that weights the number of mismatches or the number of matches. In the configuration example illustrated in FIG. 13B, weighting driver 511 weights the number of mismatches. Accordingly, weighting driver 511 includes Nch transistor pair 503. Nch transistor pair 503 is cascode-connected between detection node MISS and ground. Clock signal CLK is input to the gate of each transistor in Nch transistor pair 503.

Thus weighting driver 511 provides Nch transistor pair 503, which is similar to Nch transistor pair 501 or 502 in match detection driver 510, at detection node MISS, and Nch transistor pair 503 is grounded.

Weighting driver 511, which is constituted by Nch transistor pair 503, acts so as to lower the potential at the MISS node while clock signal CLK is at H level.

Embodiment 2 described the pixel data as having an odd-numbered bit width, i.e., 5. When the pixel data has an odd number of bits, the Hamming distance of the pixel data read out in succession cannot take on a value of n/2. In other words, a majority decision can always be reached when the pixel data has an odd number of bits, and thus a decision ending in a draw is not possible.

However, when the pixel data has an even number of bits (n), the Hamming distance may be n/2, and if the Hamming distance is n/2 during the successive pixel readout, a majority decision cannot be reached (i.e., ends in a tie). With majority detecting circuit 500 according to Embodiment 2, variations between the transistors as well as external influences such as temperature conditions, voltage conditions, and noise can result in an unstable inversion flag FLIP_I being output, which in turn leads to an increase in power consumption.

However, with majority detecting circuit 550 according to Embodiment 3, when the Hamming distance is n/2, the potential of the MISS node drops more than that of the HIT node, resulting in inversion flag FLIP_I being output at L level. This makes it possible for majority detecting circuit 550 to output inversion flag FLIP_I stably, which in turn makes it possible to reduce the power consumption and noise.

As described thus far, majority detecting circuit 500 of the solid-state imaging device according to an aspect of the present embodiment further includes a weighting circuit (i.e., weighting driver 511) that weights a total number of mismatches or a total number of matches.

According to this configuration, a situation where the result of the majority decision ends in a tie can be avoided. In other words, a situation where the number of mismatches is the same as the number of matches can be avoided. To rephrase, even when n (bits) is an even number, a case where the majority decision results in a tie is forcibly changed to a majority decision result that is not a tie, which makes it possible to stabilize the circuit operations.

Note that in FIG. 13B, Nch transistor pair 503 may be cascode-connected between detection node HIT and the ground, instead of between detection node MISS and the ground. By doing so, weighting driver 511 can weight the number of matches in the majority decision.

Additionally, a plurality of weighting drivers 511 may be provided. This makes it possible to increase the weighted number (bit number).

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described thus far, the present disclosure can achieve a reduction in source voltage and improvements in image quality characteristics, and is therefore useful in a wide range of applications, such as vehicle-mounted monitoring cameras, professional cameras used for broadcast or film-making, digital still cameras, video cameras, public surveillance cameras, medical endoscopic cameras, and the like that use MOS solid-state imaging devices or organic film-based solid state imaging devices.

What is claimed is:

1. A solid-state imaging device, comprising:
a latch circuit that holds a digital signal constituting pixel data, the digital signal having 1 bit;
a driver circuit that outputs the digital signal held in the latch circuit to a read bit line pair;
a sense amplifier connected to the read bit line pair; and
a selector circuit that selects whether the digital signal to be output from the sense amplifier is to be output in normal form or in inverted form.

2. The solid-state imaging device according to claim 1, further comprising:
a comparing circuit that compares a first digital signal with a second digital signal, the first digital signal and the second digital signal being ones of the digital signal output from the sense amplifier in successive cycles, and the second digital signal being output in a next cycle after a cycle in which the first digital signal is output,
wherein the selector circuit selects whether to output the digital signal in normal form or in inverted form in accordance with a comparison result from the comparing circuit.

3. The solid-state imaging device according to claim 1, comprising:
a pixel array in which a plurality of pixel units that carry out photoelectric conversion are arranged in rows and columns;
an AD converter that converts analog signals from the plurality of pixel units into digital signals on a column-by-column basis;
a plurality of latch circuits provided on a column-by-column basis and holding the digital signals, the plurality of latch circuits each being the latch circuit;
a plurality of driver circuits that sequentially output the digital signals held in the plurality of latch circuits on a column-by-column basis, the plurality of driver circuits each being the driver circuit;
a plurality of read bit line pairs respectively connected to the plurality of driver circuits, the plurality of read bit line pairs each being the read bit line pair;
a plurality of sense amplifiers respectively connected to the plurality of read bit line pairs, the plurality of sense amplifiers each being the sense amplifier; and
a plurality of selector circuits that select whether the digital signals output sequentially from the plurality of sense amplifiers are to be output in normal form or in inverted form, on a column-by-column basis, the plurality of selector circuits each being the selector circuit.

4. The solid-state imaging device according to claim 3, further comprising:
a plurality of comparing circuits that compare, on a bit-by-bit basis, first pixel data with second pixel data, the first pixel data and the second pixel data being ones of the digital signals output from the plurality of sense amplifiers in successive cycles; and
a majority detecting circuit that detects a majority decision result based on a total number of mismatches in comparison results from the plurality of comparing circuits,
wherein the plurality of selector circuits select whether to output in normal form or in inverted form in accordance with the majority decision result.

5. The solid-state imaging device according to claim 4, wherein when the majority decision result is true, the plurality of selector circuits output the digital signals in inverted form.

6. The solid-state imaging device according to claim 4, wherein when the majority decision result is false, the plurality of selector circuits output the digital signals in normal form.

7. The solid-state imaging device according to claim 4, wherein the majority detecting circuit outputs a signal indicating the majority decision result, as a signal indicating whether the digital signal is inverted or normal, at the same time as the digital signal.

8. The solid-state imaging device according to claim 3,
wherein the AD converter converts the analog signals into digital signals each having n bits, n being an integer of 2 or greater,
a number of the plurality of latch circuits provided in each of the columns is n,
a number of the plurality of driver circuits provided in each of the columns is n,
a number of the plurality of read bit line pairs that are provided is n,
the plurality of read bit line pairs are respectively connected to the driver circuits that are arranged in a row direction,
a number of the plurality of sense amplifiers that are provided is n, and
a number of the plurality of selector circuits that are provided is n.

9. The solid-state imaging device according to claim 3, wherein the plurality of selector circuits are input with a clock signal having a cycle k times a cycle of an operating clock signal as a selection control signal, k being an integer of 2 or greater.

10. The solid-state imaging device according to claim 3, comprising:
a plurality of output buffers that output the digital signals output from the plurality of selector circuits; and
a signal processor that digitally processes the digital signals from the plurality of output buffers.

11. The solid-state imaging device according to claim 4, wherein the majority detecting circuit includes:
a plurality of match detection driver circuits corresponding to the plurality of comparing circuits;
a first line that is pulled up to a predetermined potential via a first resistance element;
a second line that is pulled up to the predetermined potential via a second resistance element; and
a detection circuit connected to the first line and the second line,
wherein each of the plurality of match detection driver circuits lowers a potential of the first line when the comparison result from the corresponding comparing circuit indicates a mismatch, and lowers a potential of the second line when the comparison result from the corresponding comparing circuit indicates a match, and
when the potential of the first line is lower than the potential of the second line, the detection circuit detects that the majority decision result is true, and when the potential of the first line is higher than the potential of the second line, the detection circuit detects that the majority decision result is false.

12. The solid-state imaging device according to claim 11, wherein each of the plurality of match detection driver circuits includes:
a first transistor pair cascode-connected between the first line and a ground; and
a second transistor pair cascode-connected between the second line and a ground, wherein a signal indicating the comparison result from a corresponding comparing circuit is input to a gate of one of transistors constituting the first transistor pair, and a signal indicating an inverted form of the comparison result from a corresponding comparing circuit is input to a gate of one of transistors constituting the second transistor pair.

13. The solid-state imaging device according to claim 4, wherein the majority detecting circuit further includes a weighting circuit that weights a total number of mismatches or a total number of matches.

* * * * *